(12) United States Patent
Jang et al.

(10) Patent No.: US 8,422,621 B2
(45) Date of Patent: Apr. 16, 2013

(54) SHIFT REGISTER

(75) Inventors: Yong-Ho Jang, Goyang-si (KR); Seung-Chan Choi, Goyang-si (KR); Jae-Yong You, Seoul (KR); Woo-Seok Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/339,239

(22) Filed: Dec. 28, 2011

(65) Prior Publication Data

US 2012/0269316 A1  Oct. 25, 2012

(30) Foreign Application Priority Data

Apr. 21, 2011  (KR) .................. 10-2011-0037135

(51) Int. Cl.
*G11C 19/00* (2006.01)

(52) U.S. Cl.
USPC .................................. 377/64; 377/69; 377/79

(58) Field of Classification Search ............. 377/64, 377/68, 69, 77–80
See application file for complete search history.

(56) References Cited

U.S. PATENT DOCUMENTS

| | | | | |
|---|---|---|---|---|
| 7,859,507 B2 * | 12/2010 | Jang et al. | ...... | 345/100 |
| 8,253,680 B2 * | 8/2012 | Jang et al. | ...... | 345/100 |
| 2006/0139292 A1 * | 6/2006 | Yoon et al. | ...... | 345/100 |
| 2006/0269038 A1 * | 11/2006 | Jang et al. | ...... | 377/64 |
| 2006/0290390 A1 * | 12/2006 | Jang et al. | ...... | 327/112 |
| 2007/0086558 A1 * | 4/2007 | Wei et al. | ...... | 377/64 |
| 2007/0104307 A1 * | 5/2007 | Kim et al. | ...... | 377/64 |
| 2007/0217564 A1 * | 9/2007 | Tobita | ...... | 377/64 |
| 2011/0255653 A1 * | 10/2011 | Chae | ...... | 377/79 |
| 2012/0163528 A1 * | 6/2012 | Jang et al. | ...... | 377/64 |
| 2012/0207266 A1 * | 8/2012 | Tobita et al. | ...... | 377/64 |
| 2012/0269315 A1 * | 10/2012 | Jang et al. | ...... | 377/75 |

* cited by examiner

*Primary Examiner* — Tuan T Lam

(74) *Attorney, Agent, or Firm* — Birch, Stewart, Kolasch & Birch, LLP

(57) ABSTRACT

A shift register is provided in which leakage of charges from a voltage at a set node is prevented to stabilize an output from a stage. The shift register includes stages for sequentially outputting scan pulses. An nth one of the stages includes a node controller for controlling voltages at nodes, and an output unit for outputting any one of a corresponding one of the scan pulses and a first discharging voltage according to the voltages at the nodes. The nodes include set and reset nodes. The node controller of the nth stage includes a first switching device controlled by a voltage supplied to the reset node for supplying a second discharging voltage to the set node, and an inverter circuit controlled by a voltage supplied to the set node for supplying any one of a charging voltage and a third discharging voltage to the reset node.

14 Claims, 16 Drawing Sheets

SHIFT REGISTER

This application claims the benefit of Korean Patent Application No. 10-2011-0037135 filed on Apr. 21, 2011 which is hereby incorporated by reference as if fully set forth herein.

BACKGROUND OF THE INVENTION

1. Field of the Invention

The present invention relates to a shift register, and more particularly, to a shift register in which leakage of charges from a voltage at a set node is prevented to stabilize an output from a stage.

2. Discussion of the Related Art

A shift register outputs a plurality of scan pulses in order to sequentially drive gate lines of a display device, such as a liquid crystal display. To this end, the shift register includes a plurality of switching devices therein. An oxide semiconductor transistor may be employed as such a switching device.

FIG. 1 is a view illustrating relational characteristics between a gate voltage and drain current of a conventional oxide semiconductor transistor based on temperature.

For an N-type oxide semiconductor transistor used in a shift register, it is preferable that a threshold voltage thereof have a positive value. However, as temperature increases, the threshold voltage of the oxide semiconductor transistor moves negatively, as shown in FIG. 1. For this reason, the N-type oxide semiconductor transistor, which has to be turned off in an output period of the shift register, may not be normally turned off at a high temperature, thereby generating leakage current. This leakage current may lower a voltage at a set node, resulting in a problem that the output of the shift register is not normally generated.

FIG. 2 is a view illustrating a voltage at a set node and a voltage of a scan pulse based on a variation in a threshold voltage of a conventional oxide semiconductor transistor.

As can be seen from FIG. 2(a), when the threshold voltage of the oxide semiconductor transistor is −1, the voltage at the set node rapidly falls due to leakage current of the oxide semiconductor transistor, so that the voltage of the scan pulse, which is an output of a shift register, rapidly falls too.

Also, as can be seen from FIG. 2(b), when the threshold voltage of the oxide semiconductor transistor is −3, the leakage current of the oxide semiconductor transistor increases still further, so that the voltage at the set node cannot even rise, thereby causing the scan pulse not to be generated at all.

SUMMARY OF THE INVENTION

Accordingly, the present invention is directed to a shift register that substantially obviates one or more problems due to limitations and disadvantages of the related art.

An object of the present invention is to provide a shift register in which the levels of discharging voltages supplied to the gate electrode and source electrode of a switching device which is in charge of discharging of a set node are set in such a manner that the discharging voltage supplied to the gate electrode is kept lower than the discharging voltage supplied to the source electrode, thereby completely turning off the switching device in an output period, so as to normally generate a scan pulse.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages for sequentially outputting scan pulses, wherein an nth one of the stages (where n is a natural number) includes a node controller for controlling voltages at nodes, and an output unit for outputting any one of a corresponding one of the scan pulses and a first discharging voltage in response to the voltages at the nodes, wherein the nodes include a set node and a reset node, wherein the node controller of the nth stage includes a first switching device controlled by a voltage supplied to the reset node for supplying a second discharging voltage to the set node, and an inverter circuit controlled by a voltage supplied to the set node for supplying any one of a charging voltage and a third discharging voltage to the reset node, wherein the third discharging voltage is lower than the second discharging voltage.

The inverter circuit may supply the third discharging voltage corresponding to a low logic value to the reset node when a voltage corresponding to a high logic value is supplied to the set node, and supply the charging voltage corresponding to a high logic value to the reset node when a voltage corresponding to a low logic value is supplied to the set node.

The inverter circuit may include a first inverting switching device controlled according to the charging voltage and connected between a charging voltage line transferring the charging voltage and the reset node, and a second inverting switching device controlled according to a voltage at the set node and connected between the reset node and a third discharging voltage line transferring the third discharging voltage.

Alternatively, the inverter circuit may include a first inverting switching device controlled according to an external control signal and connected between a charging voltage line transferring the charging voltage and the reset node, and a second inverting switching device controlled according to a voltage at the set node and connected between the reset node and a third discharging voltage line transferring the third discharging voltage.

As another alternative, the inverter circuit may include a first inverting switching device controlled according to the charging voltage and connected between a charging voltage line transferring the charging voltage and a common node, a second inverting switching device controlled according to a voltage at the set node and connected between the common node and a fourth discharging voltage line transferring a fourth discharging voltage, a third inverting switching device controlled according to a voltage at the common node and connected between the charging voltage line and the reset node, and a fourth inverting switching device controlled according to the voltage at the set node and connected between the reset node and a third discharging voltage line transferring the third discharging voltage.

The third discharging voltage and the fourth discharging voltage may be the same.

Alternatively, the fourth discharging voltage may be equal to or lower than the third discharging voltage.

As another alternative, the inverter circuit may include a first inverting switching device controlled according to the charging voltage and connected between a charging voltage line transferring the charging voltage and a common node, a second inverting switching device controlled according to a voltage at the set node and connected between the common node and a fourth discharging voltage line transferring a fourth discharging voltage, a third inverting switching device controlled according to a voltage at the common node and connected between the charging voltage line and the reset node, and a fourth inverting switching device controlled according to the voltage at the set node and connected between the reset node and a first discharging voltage line transferring the first discharging voltage.

The first discharging voltage may be the same as any one of the second discharging voltage and third discharging voltage.

Alternatively, the first discharging voltage may be lower than the second discharging voltage.

The node controller of the nth stage may further include a second switching device controlled by a scan pulse from an (n−p)th one of the stages (where p is a natural number less than n) and connected between a charging voltage line transferring the charging voltage and the set node, and a third switching device controlled by a scan pulse from an (n+q)th one of the stages (where q is a natural number) and connected between the set node and a second discharging voltage line transferring the second discharging voltage.

The node controller of the nth stage may further include a fourth switching device controlled by the scan pulse from the (n−p)th stage and connected between the reset node and a third discharging voltage line transferring the third discharging voltage.

Alternatively, the node controller of the nth stage may further include a fourth switching device controlled by the scan pulse from the (n−p)th stage and connected between the reset node and the second discharging voltage line transferring the second discharging voltage.

The output unit of the nth stage may include a pull-up switching device controlled by a voltage at the set node and connected between a clock transfer line transferring any one of a plurality of clock pulses having phase differences thereamong and an output terminal of the nth stage, and a pull-down switching device controlled by a voltage at the reset node and connected between the output terminal and a first discharging voltage line transferring the first discharging voltage.

In accordance with another aspect of the present invention, a shift register includes a plurality of stages for sequentially outputting scan pulses, wherein an nth one of the stages (where n is a natural number) includes a node controller for controlling voltages at nodes, and an output unit for outputting any one of a corresponding one of the scan pulses and a first discharging voltage in response to the voltages at the nodes, wherein the nodes include a set node, a first reset node and a second reset node, wherein the node controller of the nth stage includes a first switching device controlled by a voltage supplied to the first reset node for supplying a second discharging voltage to the set node, a second switching device controlled by a voltage supplied to the second reset node for supplying the second discharging voltage to the set node, a first inverter circuit controlled by a voltage supplied to the set node for supplying any one of a first charging voltage and a third discharging voltage to the first reset node, and a second inverter circuit controlled by the voltage supplied to the set node for supplying any one of a second charging voltage and a fourth discharging voltage to the second reset node, wherein the third discharging voltage and the fourth discharging voltage are lower than the second discharging voltage.

The first inverter circuit may supply the third discharging voltage to the first reset node when a voltage corresponding to a high logic value is supplied to the set node, and supply the first charging voltage to the first reset node when a voltage corresponding to a low logic value is supplied to the set node, and the second inverter circuit may supply the fourth discharging voltage to the second reset node when the voltage corresponding to the high logic value is supplied to the set node, and supply the second charging voltage to the second reset node when the voltage corresponding to the low logic value is supplied to the set node, wherein each of the first charging voltage and second charging voltage may alternately have a high voltage and a low voltage at intervals of m frame periods (where m is a natural number), wherein the first charging voltage and the second charging voltage may have different voltages in the same frame period.

The first inverter circuit may include a first inverting switching device controlled according to the first charging voltage and connected between a first charging voltage line transferring the first charging voltage and the first reset node, and a second inverting switching device controlled according to a voltage at the set node and connected between the first reset node and a third discharging voltage line transferring the third discharging voltage, and the second inverter circuit may include a third inverting switching device controlled according to the second charging voltage and connected between a second charging voltage line transferring the second charging voltage and the second reset node, and a fourth inverting switching device controlled according to the voltage at the set node and connected between the second reset node and a fourth discharging voltage line transferring the fourth discharging voltage.

Alternatively, the first inverter circuit may include a first inverting switching device controlled according to an external first control signal and connected between a first charging voltage line transferring the first charging voltage and the first reset node, and a second inverting switching device controlled according to a voltage at the set node and connected between the first reset node and a third discharging voltage line transferring the third discharging voltage, and the second inverter circuit may include a third inverting switching device controlled according to an external second control signal and connected between a second charging voltage line transferring the second charging voltage and the second reset node, and a fourth inverting switching device controlled according to the voltage at the set node and connected between the second reset node and a fourth discharging voltage line transferring the fourth discharging voltage.

As another alternative, the first inverter circuit may include a first inverting switching device controlled according to the first charging voltage and connected between a first charging voltage line transferring the first charging voltage and a first common node, a second inverting switching device controlled according to a voltage at the set node and connected between the first common node and a fifth discharging voltage line transferring a fifth discharging voltage, a third inverting switching device controlled according to a voltage at the first common node and connected between the first charging voltage line and the first reset node, and a fourth inverting switching device controlled according to the voltage at the set node and connected between the first reset node and a third discharging voltage line transferring the third discharging voltage, and the second inverter circuit may include a fifth inverting switching device controlled according to the second charging voltage and connected between a second charging voltage line transferring the second charging voltage and a second common node, a sixth inverting switching device controlled according to the voltage at the set node and connected between the second common node and a sixth discharging voltage line transferring a sixth discharging voltage, a seventh inverting switching device controlled according to a voltage at the second common node and connected between the second charging voltage line and the second reset node, and an eighth inverting switching device controlled according to the voltage at the set node and connected between the second reset node and a fourth discharging voltage line transferring the fourth discharging voltage.

The first discharging voltage may be the same as any one of the second discharging voltage and third discharging voltage.

Alternatively, the first discharging voltage may be lower than the second discharging voltage.

The third discharging voltage may be the same as the fourth discharging voltage.

The third discharging voltage and the fourth discharging voltage may be lower than the first discharging voltage.

The node controller of the nth stage may further include a third switching device controlled by a scan pulse from an (n−p)th one of the stages (where p is a natural number less than n) and connected between a charging voltage line transferring a charging voltage and the set node, and a fourth switching device controlled by a scan pulse from an (n+q)th one of the stages (where q is a natural number) and connected between the set node and a second discharging voltage line transferring the second discharging voltage.

The node controller of the nth stage may further include a fifth switching device controlled by the scan pulse from the (n−p)th stage and connected between the first reset node and a third discharging voltage line transferring the third discharging voltage, and a sixth switching device controlled by the scan pulse from the (n−p)th stage and connected between the second reset node and the third discharging voltage line.

The output unit of the nth stage may include a pull-up switching device controlled by a voltage at the set node and connected between a clock transfer line transferring any one of a plurality of clock pulses having phase differences thereamong and an output terminal of the nth stage, a first pull-down switching device controlled by a voltage at the first reset node and connected between the output terminal and a first discharging voltage line transferring the first discharging voltage, and a second pull-down switching device controlled by a voltage at the second reset node and connected between the output terminal and the first discharging voltage line transferring the first discharging voltage.

The control signal may be any one of a plurality of clock pulses having phase differences thereamong, wherein the control signal supplied to the first inverting switching device in the nth stage may be one of the clock pulses corresponding to the scan pulse output from the nth stage.

Each of the first and second control signals may be any one of a plurality of clock pulses having phase differences thereamong, wherein each of the first and second control signals supplied respectively to the first and third inverting switching devices in the nth stage may be one of the clock pulses corresponding to the scan pulse output from the nth stage.

The third to sixth discharging voltages may be all the same.

As another alternative, the inverter circuit may include a first inverting switching device controlled according to any one of a plurality of clock pulses having phase differences thereamong and connected between a clock transfer line transferring the one clock pulse and the reset node, and a second inverting switching device controlled according to a voltage at the set node and connected between the reset node and a third discharging voltage line transferring the third discharging voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
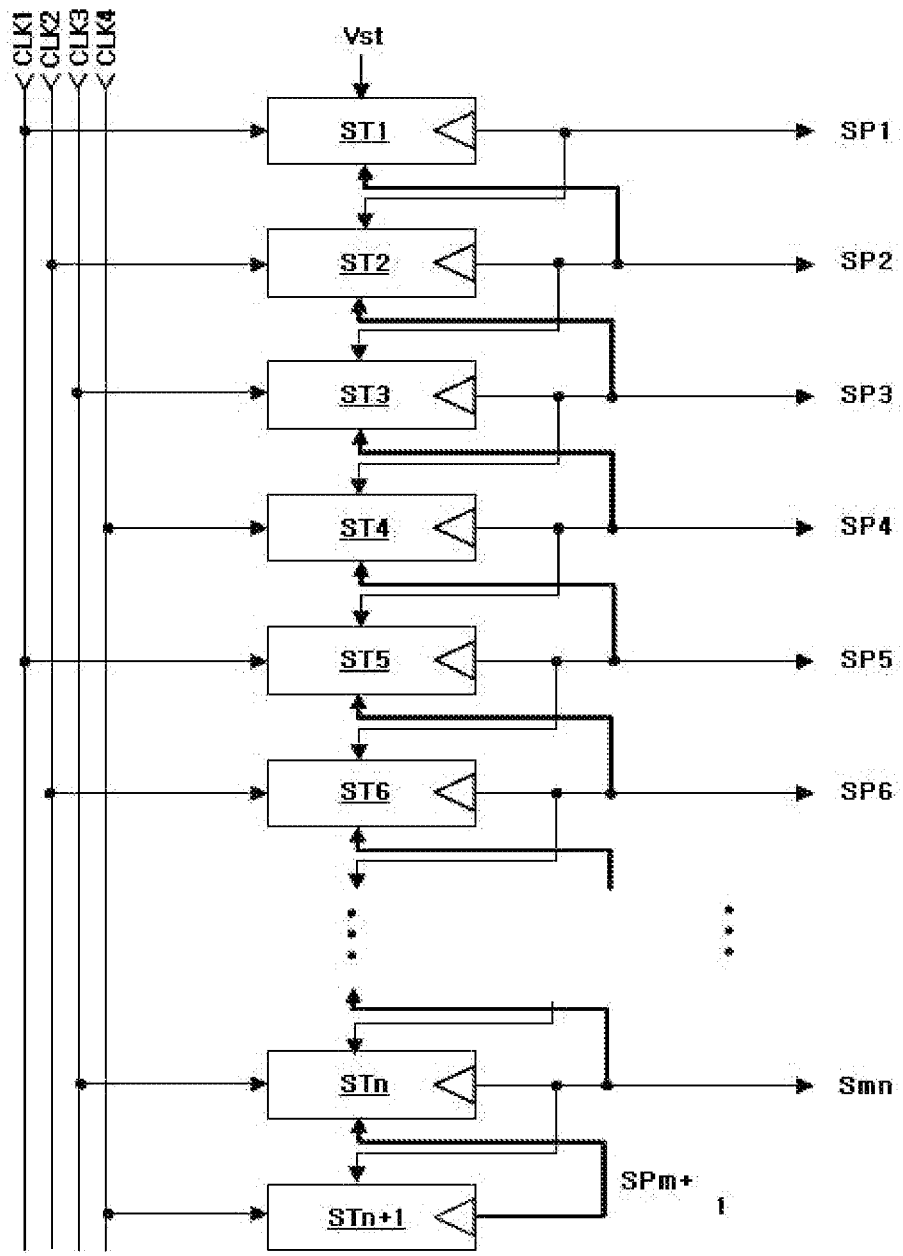
FIG. 3 is a block diagram showing the configuration of a shift register according to an embodiment of the present invention.
Figure 4:
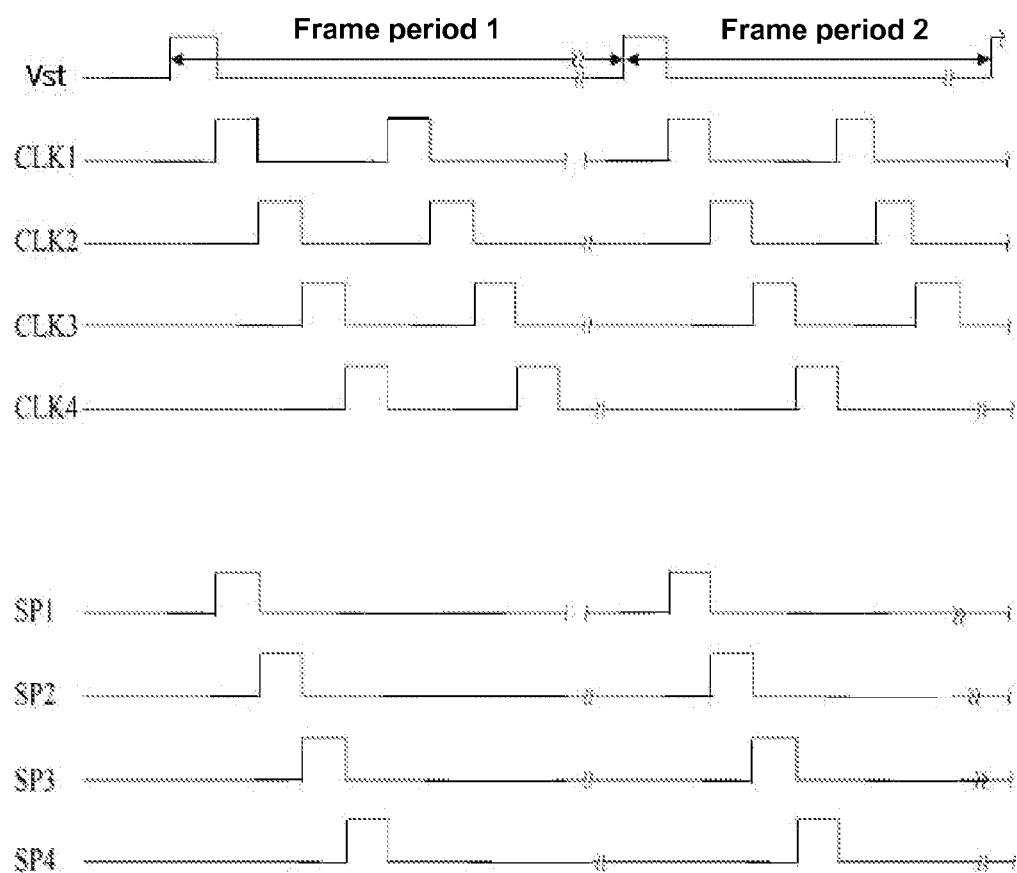
FIG. 4 is a timing diagram of various signals which are supplied to the shift register of FIG. 3 and various signals which are output therefrom.

FIG. 3 is a block diagram showing the configuration of a shift register according to an embodiment of the present invention, and FIG. 4 is a timing diagram of various signals which are supplied to the shift register of FIG. 3 and various signals which are output therefrom.

The shift register according to the present embodiment includes m stages ST1 to STm and one dummy stage STm+1, as shown in FIG. 3. Each of the stages ST1 to STm+1 outputs one scan pulse SP1 to SPm+1 for one frame period through an output terminal OT thereof.

Each of the stages ST1 to STm drives a gate line connected thereto using the scan pulse. Also, each of the stages ST1 to STm, other than the dummy stage, controls the operations of a stage downstream therefrom and a stage upstream therefrom using the scan pulse. The dummy stage controls the operation of a stage upstream therefrom.

The stages ST1 to STm+1 output the scan pulses in order from the first stage ST1 to the dummy stage STm+1. That is, the first stage ST1 outputs the first scan pulse SP1, the second stage ST2 then outputs the second scan pulse SP2, the third stage ST3 then outputs the third scan pulse SP3, . . . , the mth stage STm then outputs the mth scan pulse SPm, and the dummy stage STm+1 finally outputs the (m+1)th scan pulse SPm+1.

The scan pulses output from the stages ST1 to STm, other than the dummy stage STm+1, are sequentially supplied to gate lines of a liquid crystal panel (not shown) to sequentially scan the gate lines. Also, the scan pulse output from each of the stages is supplied only to an upstream stage, is supplied to the upstream stage and a downstream stage or is supplied only to the downstream stage. For example, a scan pulse output from an nth stage (where n is a natural number less than m) may be supplied to an nth gate line, an (n−p)th stage (where p is a natural number less than n) and an (n+q)th stage (where q is a natural number). Here, n is a natural number less than m, and the nth stage means any one of the m stages.

This shift register may be built in the liquid crystal panel. That is, the liquid crystal panel has a display region for displaying an image, and a non-display region surrounding the display region, and the shift register is built in the non-display region.

Each of the stages ST1 to STm+1 of the shift register, configured in this manner, is supplied with a charging voltage VDD, first to third discharging voltages VSS1 to VSS3, and any one of first to fourth clock pulses CLK1 to CLK4 which are output sequentially out of phase with one another and cyclically. On the other hand, the first stage ST1 and dummy stage STm+1 among the stages ST1 to STm+1 are further supplied with a start pulse Vst.

The charging voltage VDD is mainly used to charge nodes of each stage ST1 to STm+1, and the first to third discharging voltages VSS1 to VSS3 are mainly used to discharge the nodes and output terminal OT of each stage ST1 to STm+1.

The charging voltage VDD and the first to third discharging voltages VSS1 to VSS3 are all direct current (DC) voltages. The charging voltage VDD is positive and the first to third discharging voltages VSS1 to VSS3 are negative. Here, at least one of the first to third discharging voltages VSS1 to VSS3 may be a ground voltage. Particularly, the third discharging voltage VSS3 may have a value lower than that of the second discharging voltage VSS2. Also, the first discharging voltage VSS1 may have a value equal to that of the second discharging voltage VSS2 or third discharging voltage VSS3.

The first to fourth clock pulses CLK1 to CLK4 are signals which are used for the respective stages ST1 to STm+1 to generate the scan pulses SP1 to SPm+1. Each stage ST1 to STm+1 receives any one of the first to fourth clock pulses CLK1 to CLK4 and outputs a corresponding one of the scan pulses SP1 to SPm+1. For example, a (4n+1)th stage may output a corresponding scan pulse using the first clock pulse CLK1, a (4n+2)th stage may output a corresponding scan pulse using the second clock pulse CLK2, a (4n+3)th stage may output a corresponding scan pulse using the third clock pulse CLK3, and a (4n+4)th stage may output a corresponding scan pulse using the fourth clock pulse CLK4.

Although the four types of clock pulses having different phases are used for illustrative purposes in the present invention, any number of types of clock pulses may be used as long as they are two or more.

As shown in FIG. 4, the first to fourth clock pulses CLK1 to CLK4 are output in such a manner that they do not overlap with one another, and the scan pulses are output in such a manner that they do not overlap with one another.

On the other hand, although not shown, the clock pulses CLK1 to CLK4 may be output in such a manner that high durations of clock pulses output in adjacent periods overlap with each other for a certain period. For example, the first clock pulse CLK1 and second clock pulse CLK2 adjacent to each other may be output in such a manner that high durations thereof overlap with each other for a time corresponding to about ½H (horizontal period). Alternatively, the overlap time may be ⅓H. As the high durations of the adjacent clock pulses overlap with each other in this manner, the scan pulses have the same characteristics as those of the clock pulses, too. That is, the scan pulses are output in such a manner that high durations of scan pulses output in adjacent periods overlap with each other for a certain period. The start pulse Vst may overlap with the first clock pulse CLK1 or fourth clock pulse CLK4.

As shown in FIG. 3, the nth stage is enabled in response to a scan pulse from an (n−1)th stage. Exceptionally, the first stage ST1 is enabled in response to the start pulse Vst from a timing controller (not shown).

The nth stage is disabled in response to a scan pulse from an (n+1)th stage. Exceptionally, the dummy stage STm+1 is disabled in response to the start pulse Vst from the timing controller.

Hereinafter, a circuit configuration of each stage will be described in detail.

Figure 5:
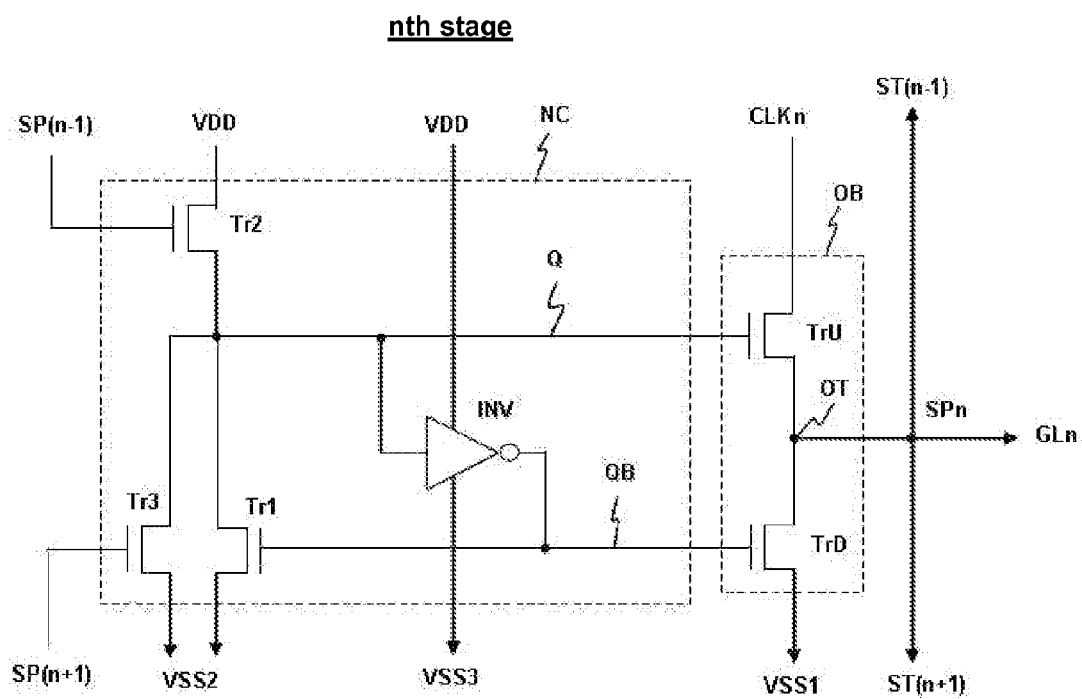
FIG. 5 is a circuit diagram of a stage according to a first embodiment of the present invention.

FIG. 5 is a circuit diagram of a stage according to a first embodiment of the present invention.

Each stage according to the first embodiment of the present invention, which will hereinafter be referred to as the nth stage, includes, as shown in FIG. 5, a node controller NC for controlling voltages at nodes, and an output unit OB for outputting any one of the corresponding scan pulse and first discharging voltage VSS1 in response to the voltages at the nodes. Here, the nodes mean a set node Q and a reset node QB, as shown in FIG. 5.

Here, the output unit OB receives any one of a plurality of clock pulses having different phases, and outputs the received clock pulse as the scan pulse through an output terminal OT thereof according to signal states of the set node Q and reset node QB or outputs the first discharging voltage VSS1 through the output terminal OT according to the signal states of the set node Q and reset node QB.

The node controller NC of the nth stage includes a first switching device Tr1 controlled by a voltage supplied to the reset node QB for supplying the second discharging voltage VSS2 to the set node Q, and an inverter circuit INV controlled by a voltage supplied to the set node Q for supplying any one of the charging voltage VDD and third discharging voltage VSS3 to the reset node QB.

When a voltage corresponding to a high logic value is supplied to the set node Q, the inverter circuit INV supplies the third discharging voltage VSS3 corresponding to a low logic value to the reset node QB. Conversely, when a voltage corresponding to a low logic value is supplied to the set node Q, the inverter circuit INV supplies the charging voltage VDD corresponding to a high logic value to the reset node QB.

As stated previously, the third discharging voltage VSS3 has a value lower than that of the second discharging voltage VSS2. As a result, when the set node Q is maintained at a voltage of a high logic value (charging voltage VDD) and the reset node QB is maintained at a voltage of a low logic value (third discharging voltage VSS3), a voltage between the gate electrode and source electrode (referred to hereinafter as a gate-source voltage) of the first switching device Tr1 may have a value lower than that of a threshold voltage of the first switching device Tr1. That is, because the second discharging voltage VSS2 applied to the source electrode of the first switching device Tr1, which is an N-type metal oxide semiconductor (NMOS) transistor, has a value higher than the third discharging voltage VSS3 applied to the gate electrode of the first switching device Tr1, the gate-source voltage of the first switching device Tr1 has a negative value, thereby enabling the first switching device Tr1 to be kept completely turned off.

Here, the charging voltage VDD is transferred by a charging voltage line, the first discharging voltage VSS1 is transferred by a first discharging voltage line, the second discharging voltage VSS2 is transferred by a second discharging voltage line, and the third discharging voltage VSS3 is transferred by a third discharging voltage line.

On the other hand, the node controller NC of the nth stage may further include second and third switching devices Tr2 and Tr3, as shown in FIG. 5.

The second switching device Tr2 is controlled by a scan pulse from the (n−p)th stage and is connected between the charging voltage line which transfers the charging voltage VDD and the set node Q. For example, the second switching device Tr2 may be turned on by the scan pulse from the (n−1)th stage to interconnect the charging voltage line and the set node Q.

The third switching device Tr3 is controlled by a scan pulse from the (n+q)th stage and is connected between the set node Q and the second discharging voltage line which transfers the second discharging voltage VSS2. For example, the third switching device Tr3 may be turned on by the scan pulse from the (n+1)th stage to interconnect the set node Q and the second discharging voltage line.

The configuration of the inverter circuit INV in FIG. 5 will hereinafter be described in more detail.

Figure 6:
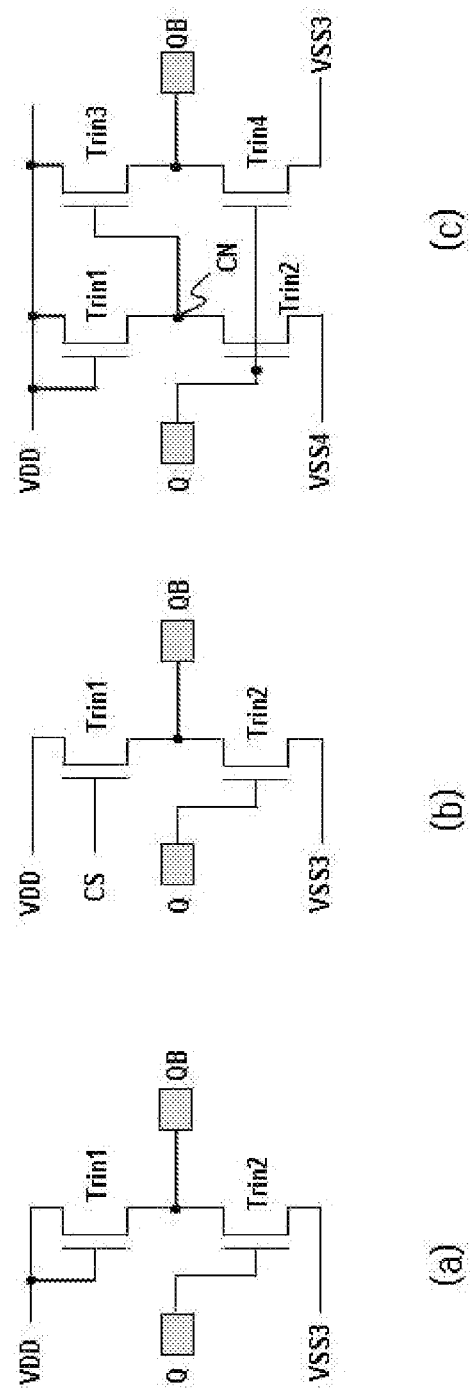
FIG. 6 is a circuit diagram showing a variety of configurations of an inverter circuit in FIG. 5.

FIG. 6 is a circuit diagram showing a variety of configurations of the inverter circuit INV in FIG. 5. The inverter circuit INV in FIG. 5 may include any one of circuit configurations shown in FIGS. 6(a), 6(b) and 6(c).

The inverter circuit INV includes first and second inverting switching devices Trin1 and Trin2, as shown in FIG. 6(a).

The first inverting switching device Trin1 is controlled according to the charging voltage VDD and is connected between the charging voltage line which transfers the charging voltage VDD and the reset node QB. Alternatively, any one clock pulse may be supplied to the first inverting switching device Trin1 instead of the above-stated charging voltage VDD. That is, this first inverting switching device Trin1 may be controlled according to any one of a plurality of clock pulses having phase differences thereamong and be connected between a clock transfer line which transfers the one clock pulse and the reset node QB.

The second inverting switching device Trin2 is controlled according to a voltage at the set node Q and is connected between the reset node QB and the third discharging voltage line which transfers the third discharging voltage VSS3.

Alternatively, the inverter circuit INV may include first and second inverting switching devices Trin1 and Trin2, as shown in FIG. 6(b).

The first inverting switching device Trin1 is controlled according to an external control signal CS and is connected between the charging voltage line which transfers the charging voltage VDD and the reset node QB. Here, the control signal CS may be any one of a plurality of clock pulses having phase differences thereamong. In detail, the control signal CS supplied to the first inverting switching device Trin1 provided in the nth stage may be a clock pulse corresponding to the scan pulse output from the nth stage. For example, the first inverting switching device Trin1 provided in the second stage ST2 may be supplied with, as the control signal CS, the second clock pulse CLK2 which is used as the second scan pulse SP2.

The second inverting switching device Trin2 is controlled according to the voltage at the set node Q and is connected between the reset node QB and the third discharging voltage line which transfers the third discharging voltage VSS3.

As another alternative, the inverter circuit INV may include first to fourth inverting switching devices Trin1, Trin2, Trin3 and Trin4, as shown in FIG. 6(c).

The first inverting switching device Trin1 is controlled according to the charging voltage VDD and is connected between the charging voltage line which transfers the charging voltage VDD and a common node CN.

The second inverting switching device Trin2 is controlled according to the voltage at the set node Q and is connected between the common node CN and a fourth discharging voltage line which transfers a fourth discharging voltage VSS4.

The third inverting switching device Trin3 is controlled according to a voltage at the common node CN and is connected between the charging voltage line and the reset node QB.

The fourth inverting switching device Trin4 is controlled according to the voltage at the set node Q and is connected between the reset node QB and the third discharging voltage line which transfers the third discharging voltage VSS3.

Here, the third discharging voltage VSS3 and the fourth discharging voltage VSS4 may have the same value. Alternatively, the fourth discharging voltage VSS4 may have a value equal to or lower than the third discharging voltage VSS3.

Figure 7:
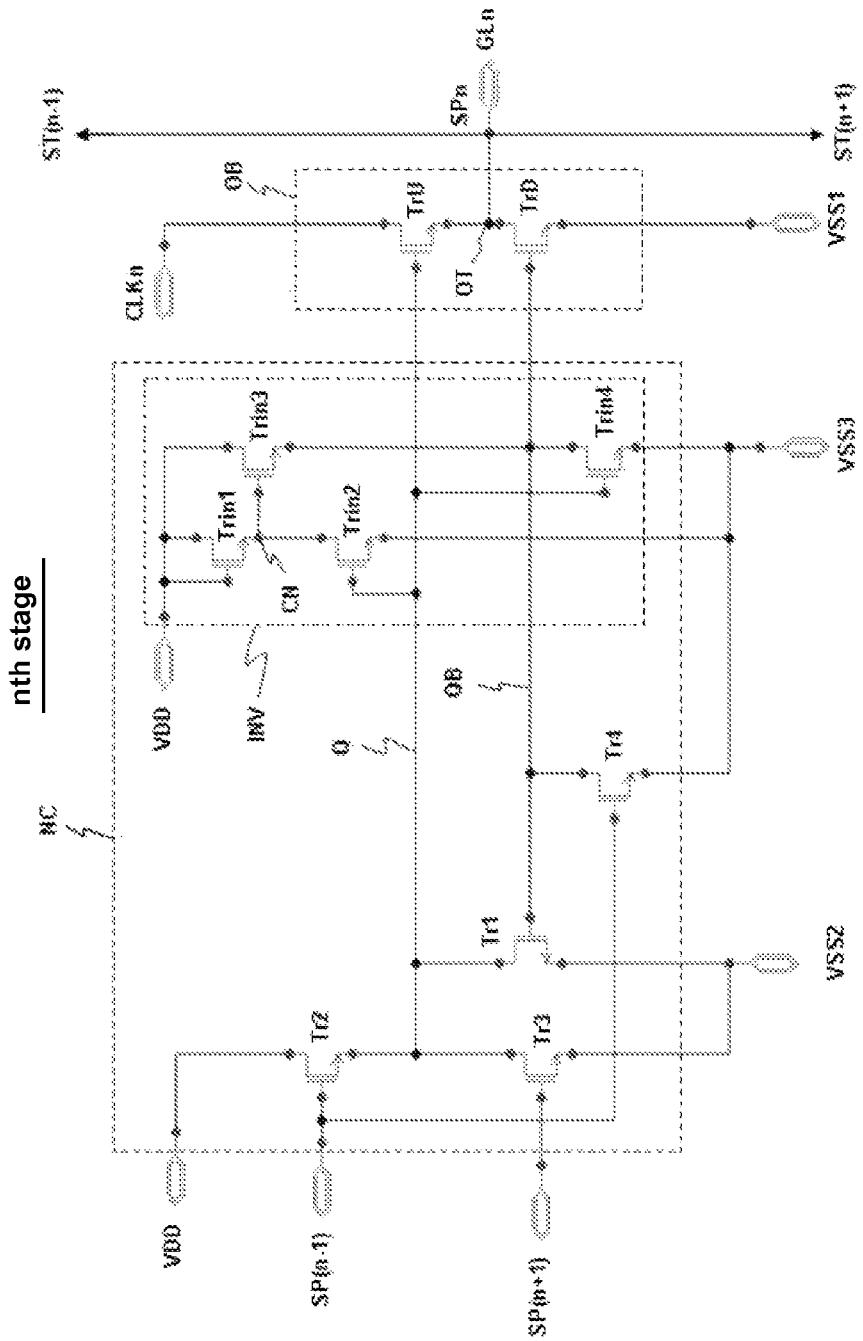
FIG. 7 is a circuit diagram showing the configuration of an nth stage of FIG. 5 in detail.

FIG. 7 is a circuit diagram showing the configuration of the nth stage of FIG. 5 in detail.

The inverter circuit INV in FIG. 7 may include any one of the circuit configurations shown in FIGS. 6(a), 6(b) and 6(c). FIG. 7 shows one example in which the nth stage has the inverter circuit INV shown in FIG. 6(c).

Figure 1:
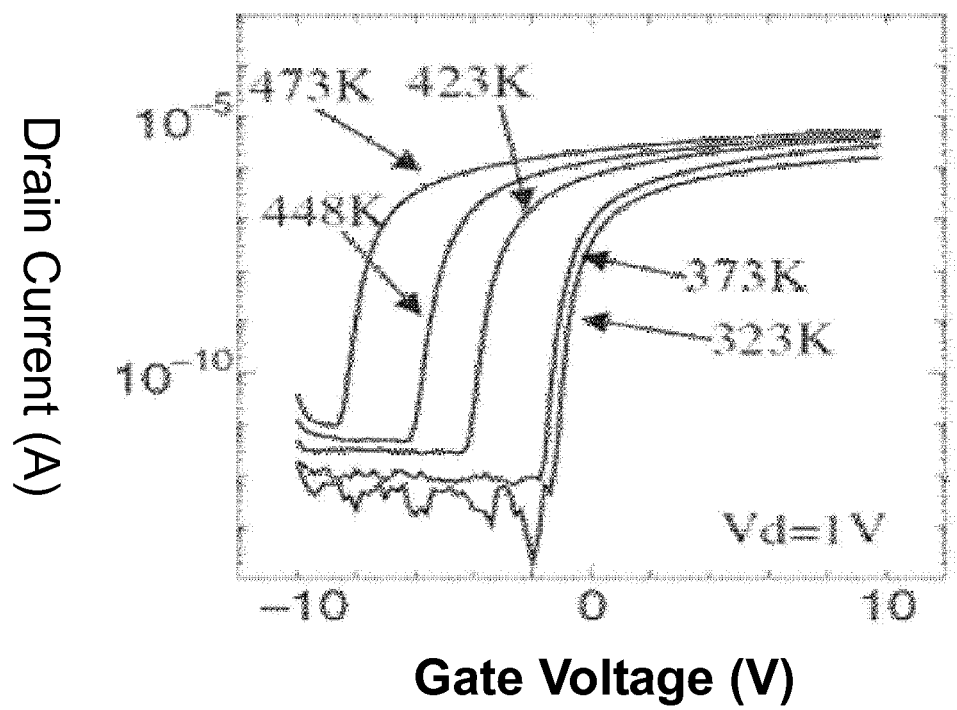
FIG. 1 is a view illustrating relational characteristics between a gate voltage and drain current of a conventional oxide semiconductor transistor based on temperature.
Figure 2:
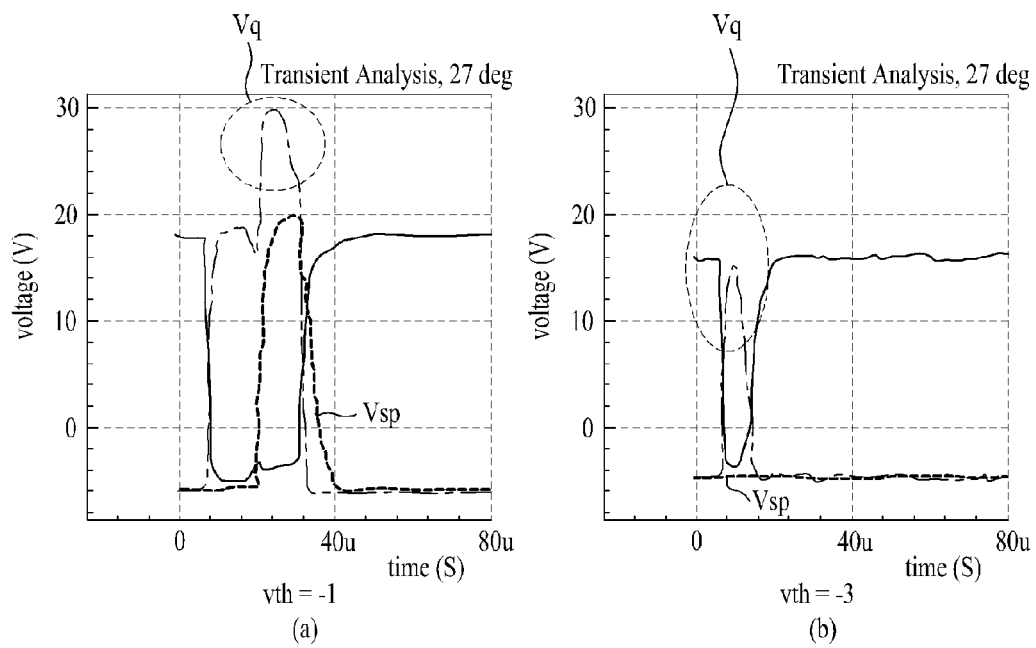
FIG. 2 is a view illustrating a voltage at a set node and a voltage of a scan pulse based on a variation in a threshold voltage of a conventional oxide semiconductor transistor.

The node controller NC of the nth stage includes first to fourth switching devices Tr1, Tr2, Tr3 and Tr4, as shown in FIG. 7. The configurations of the first to third switching devices Tr1 to Tr3 among them are the same as those of the first to third switching devices Tr1 to Tr3 described above with reference to FIG. 2, and a description thereof will thus be substituted by the description of the configurations of the first to third switching devices Tr1 to Tr3 in FIG. 2.

The fourth switching device Tr4 is controlled by the scan pulse from the (n−p)th stage and is connected between the reset node QB and the third discharging voltage line which transfers the third discharging voltage VSS3.

On the other hand, the output unit OB of the nth stage includes a pull-up switching device TrU and a pull-down switching device TrD.

The pull-up switching device TrU is controlled by the voltage at the set node Q and is connected between a clock transfer line which transfers any one of the clock pulses CLK1 to CLK4 with the phase differences and the output terminal OT of the nth stage.

The pull-down switching device TrD is controlled by a voltage at the reset node QB and is connected between the output terminal OT and the first discharging voltage line which transfers the first discharging voltage VSS1.

The operation of the nth stage configured in this manner will hereinafter be described in detail with reference to FIGS. 4 and 7. Here, it is assumed that the nth stage is the third stage ST3.

First, a description will be given of an operation in a set period.

The second and fourth switching devices Tr2 and Tr4 in the third stage ST3 are turned on in response to the second scan pulse SP2 from the second stage ST2. Then, the charging voltage VDD is supplied to the set node Q through the turned-on second switching device Tr2. As a result, the set node Q is charged with a voltage corresponding to a high logic value, and the second inverting switching device Trin2, fourth inverting switching device Trin4 and pull-up switching device TrU, connected to the charged set node Q through their respective gate electrodes, are turned on. On the other hand, the first inverting switching device Trin1 is always kept turned on because it is connected between the charging voltage line and the common node CN in a diode form. Also, the third switching device Tr3 in the third stage ST3 is kept turned off because the scan pulse from the fourth stage ST4 is low in this set period.

Also, the third discharging voltage VSS3 is supplied to the reset node QB through the turned-on fourth switching device Tr4, so as to discharge the reset node QB. As a result, the first switching device Tr1 and pull-down switching device TrD, connected to the discharged reset node QB through their respective gate electrodes, are turned off.

Also, the third discharging voltage VSS3 is supplied to the common node CN through the turned-on second inverting switching device Trin2. Accordingly, the common node CN is discharged, and the third inverting switching device Trin3, connected to the discharged common node CN through the gate electrode thereof, is turned off.

Also, the third discharging voltage VSS3 is supplied to the reset node QB through the turned-on fourth inverting switching device Trin4, so as to discharge the reset node QB.

The state of the first switching device Tr1 in this set period is as follows. It can be seen that the third discharging voltage VSS3 corresponding to a low logic value is supplied to the gate electrode of the first switching device Tr1 and the second discharging voltage VSS2 corresponding to a low logic value is supplied to the source electrode of the first switching device Tr1. At this time, the gate-source voltage of the first switching device Tr1 is maintained at a negative value lower than 0, because the third discharging voltage VSS3 has a value lower than that of the second discharging voltage VSS2, as stated previously. As a result, in this set period, the first switching device Tr1 can be kept completely turned off, so that the voltage at the set node Q can be prevented from being reduced due to leakage current from the first switching device Tr1.

On the other hand, in this set period, the fourth scan pulse SP4 of the low state from the fourth stage ST4 is supplied to the gate electrode of the third switching device Tr3. This fourth scan pulse SP4 of the low state has a value lower than that of the second discharging voltage VSS2. Accordingly, the gate-source voltage of the third switching device Tr3 is maintained at a negative value lower than 0, too. As a result, in this set period, the voltage at the set node Q can be prevented from being reduced due to leakage current from the third switching device Tr3.

Next, a description will be given of an operation in an output period.

In the output period, the third clock pulse CLK3 is supplied to the drain electrode of the turned-on pull-up switching device TrU. At this time, the voltage at the floating set node Q is bootstrapped by the third clock pulse CLK3. As a result, the pull-up switching device TrU is completely turned on, and the third clock pulse CLK3 is output through the turned-on pull-up switching device TrU. That is, the third clock pulse CLK3 is output as the third scan pulse SP3 through the output terminal OT. This third scan pulse SP3 is supplied to the third gate line, the second stage ST2 and the fourth stage ST4. In detail, the third scan pulse SP3 supplied to the second stage ST2 is applied to the gate electrode of the third switching device Tr3 of the second stage ST2. Also, the third scan pulse SP3 supplied to the fourth stage ST4 is supplied to the gate electrodes of the second switching device Tr2 and fourth switching device Tr4 of the fourth stage ST4. The second stage ST2 is reset by the third scan pulse SP3, and the fourth stage ST4 is set by the third scan pulse SP3.

Next, a description will be given of an operation in a reset period.

In the reset period, the fourth scan pulse SP4 from the fourth stage ST4 is supplied to the third stage ST3. In detail, this fourth scan pulse SP4 is supplied to the gate electrode of the third switching device Tr3 of the third stage ST3. As a result, the third switching device Tr3 is turned on, and the second discharging voltage VSS2 is supplied to the set node Q through the turned-on third switching device Tr3. Accordingly, the set node Q is discharged, and the second inverting switching device Trin2, fourth inverting switching device Trin4 and pull-up switching device TrU, connected to the discharged set node Q through their respective gate electrodes, are turned off.

At this time, as the second inverting switching device Trin2 is turned off, the common node CN is charged with the charging voltage VDD, thereby causing the third inverting switching device Trin3 to be turned on. Also, as the fourth inverting switching device Trin4 is turned off, the reset node QB is charged with the charging voltage VDD. As a result, the first switching device Tr1 and pull-down switching device TrD, connected to the charged reset node QB through their respective gate electrodes, are turned on. Then, the second discharging voltage VSS2 is supplied to the set node Q through the turned-on first switching device Tr1. Also, the first discharging voltage VSS1 is supplied to the output terminal OT through the turned-on pull-down switching device TrD.

Figure 8:
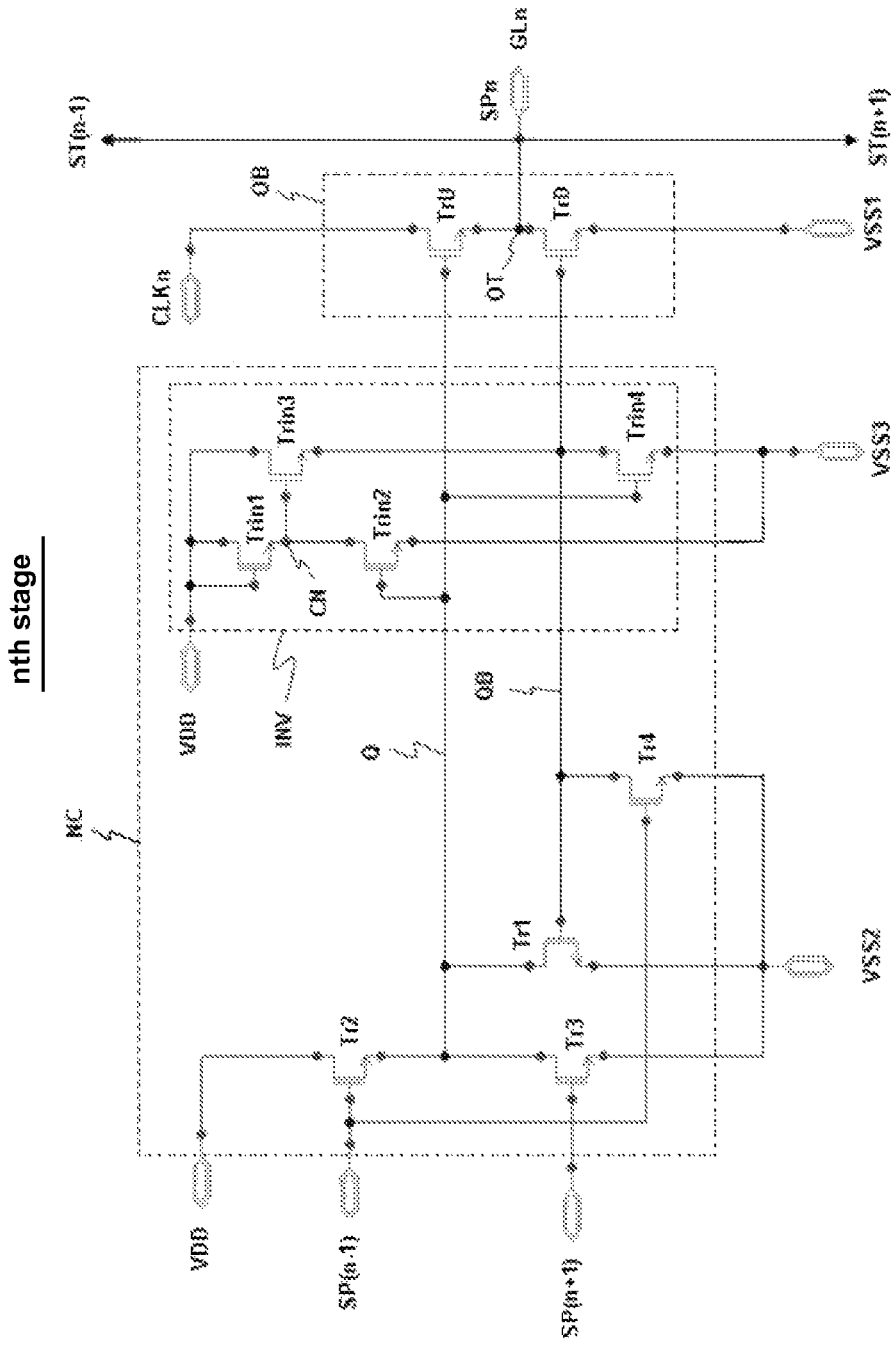
FIG. 8 is a circuit diagram showing another configuration of the nth stage of FIG. 5 in detail.

FIG. 8 is a circuit diagram showing another configuration of the nth stage of FIG. 5 in detail.

The circuit configuration of FIG. 8 is substantially the same as the circuit configuration of FIG. 7, stated above, with the exception that the fourth switching device Tr4 has a different connection arrangement. That is, according to FIG. 8, the fourth switching device Tr4 is controlled by the scan pulse from the (n−p)th stage and is connected between the reset node QB and the second discharging voltage line which transfers the second discharging voltage VSS2. Here, p is 1.

Figure 9:
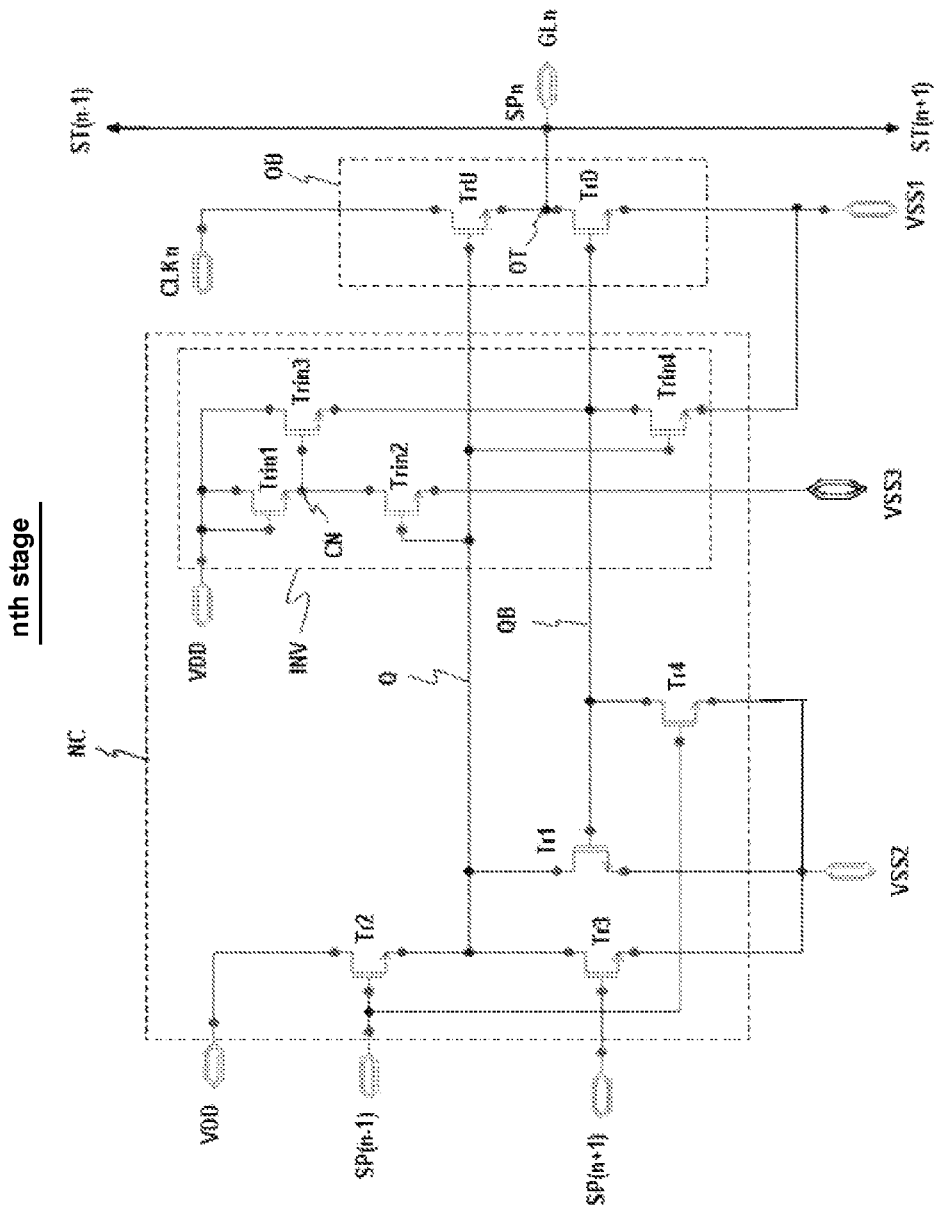
FIG. 9 is a circuit diagram showing another configuration of the nth stage of FIG. 5 in detail.

FIG. 9 is a circuit diagram showing another configuration of the nth stage of FIG. 5 in detail.

The circuit configuration of FIG. 9 is substantially the same as the circuit configuration of FIG. 8, stated above, with the exception that the fourth inverting switching device Trin4 has a different connection arrangement. That is, according to FIG. 9, the fourth inverting switching device Trin4 is controlled by the voltage at the set node Q and is connected between the reset node QB and the first discharging voltage line which transfers the first discharging voltage VSS1.

Figure 10:
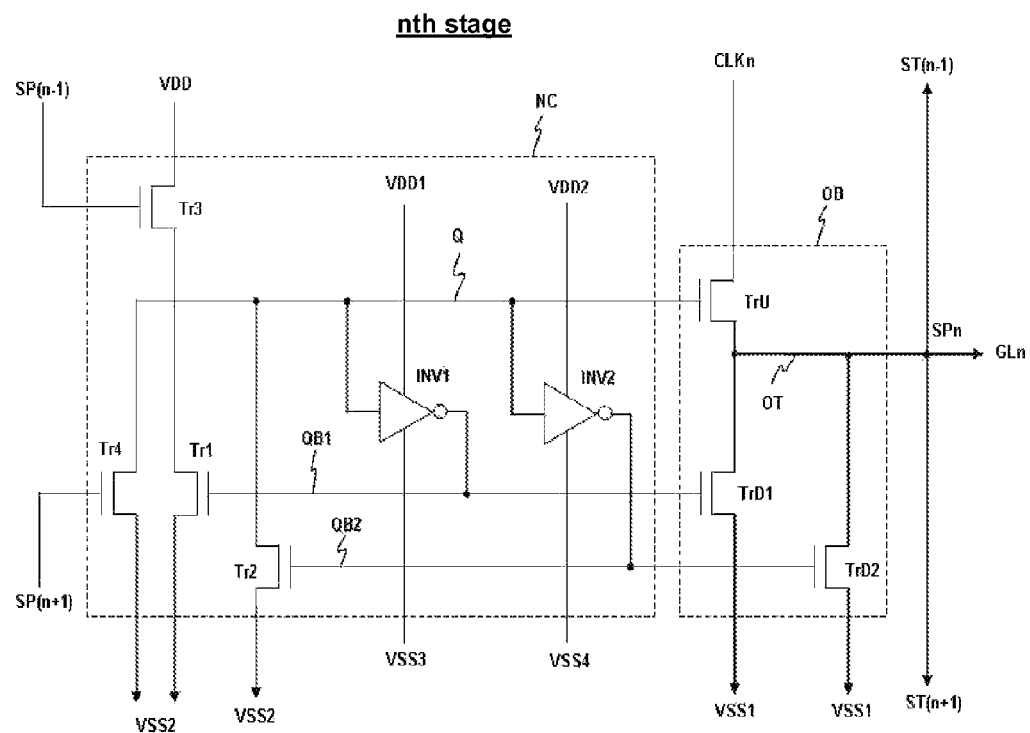
FIG. 10 is a circuit diagram of a stage according to a second embodiment of the present invention.

FIG. 10 is a circuit diagram of a stage according to a second embodiment of the present invention. The stage of FIG. 10 may be any one of the stages in FIG. 3.

Each stage according to the second embodiment of the present invention, which will hereinafter be referred to as the nth stage, includes, as shown in FIG. 10, a node controller NC for controlling voltages at nodes, and an output unit OB for outputting any one of the corresponding scan pulse and first discharging voltage VSS1 in response to the voltages at the nodes. Here, the nodes mean a set node Q, a first reset node QB1 and a second reset node QB2, as shown in FIG. 10.

Here, the output unit OB receives any one of a plurality of clock pulses having different phases, and outputs the received clock pulse as the scan pulse through an output terminal OT thereof according to signal states of the set node Q, first reset node QB1 and second reset node QB2 or outputs the first discharging voltage VSS1 through the output terminal OT according to the signal states of the set node Q, first reset node QB1 and second reset node QB2. Here, the plurality of clock pulses may be the above-stated first to fourth clock pulses CLK1 to CLK4. These clock pulses may overlap with one another, too.

The node controller NC of the nth stage includes a first switching device Tr1 controlled by a voltage supplied to the first reset node QB1 for supplying the second discharging voltage VSS2 to the set node Q, a second switching device Tr2 controlled by a voltage supplied to the second reset node QB2 for supplying the second discharging voltage VSS2 to the set node Q, a first inverter circuit INV1 controlled by a voltage supplied to the set node Q for supplying any one of a first charging voltage VDD1 and the third discharging voltage VSS3 to the first reset node QB1, and a second inverter circuit INV2 controlled by the voltage supplied to the set node Q for supplying any one of a second charging voltage VDD2 and a fourth discharging voltage VSS4 to the second reset node QB2.

The first inverter circuit INV1 supplies the third discharging voltage VSS3 to the first reset node QB1 when a voltage corresponding to a high logic value is supplied to the set node Q, and supplies the first charging voltage VDD1 to the first reset node QB1 when a voltage corresponding to a low logic value is supplied to the set node Q.

The second inverter circuit INV2 supplies the fourth discharging voltage VSS4 to the second reset node QB2 when the voltage corresponding to the high logic value is supplied to the set node Q, and supplies the second charging voltage VDD2 to the second reset node QB2 when the voltage corresponding to the low logic value is supplied to the set node Q.

Here, each of the first charging voltage VDD1 and second charging voltage VDD2 alternately has a high voltage and a low voltage at intervals of k frame periods (where k is a natural number). In the same frame period, the first charging voltage VDD1 and the second charging voltage VDD2 have different voltages. For example, in an odd frame period, the first charging voltage VDD1 may have a high voltage corresponding to a high logic value, whereas the second charging voltage VDD2 may have a low voltage corresponding to a low logic value. Also, in an even frame period, the first charging voltage VDD1 may have a low voltage corresponding to a low logic value, whereas the second charging voltage VDD2 may have a high voltage corresponding to a high logic value.

The third discharging voltage VSS3 and the fourth discharging voltage VSS4 may have the same value. In this case, both the third and fourth discharging voltage VSS3 and VSS4 have values lower than that of the second discharging voltage VSS2. As a result, when the set node Q is maintained at a voltage of a high logic value (first charging voltage VDD1 of high voltage state) and the first reset node QB1 is maintained at a voltage of a low logic value (third discharging voltage VSS3), a gate-source voltage of the first switching device Tr1 may have a value lower than that of a threshold voltage of the first switching device Tr1. That is, because the second discharging voltage VSS2 applied to the source electrode of the first switching device Tr1, which is an NMOS transistor, has a value higher than the third discharging voltage VSS3 applied to the gate electrode of the first switching device Tr1, the gate-source voltage of the first switching device Tr1 has a negative value, thereby enabling the first switching device Tr1 to be kept completely turned off.

Also, when the set node Q is maintained at a voltage of a high logic value (second charging voltage VDD2 of high voltage state) and the second reset node QB2 is maintained at a voltage of a low logic value (fourth discharging voltage VSS4), a gate-source voltage of the second switching device Tr2 may have a value lower than that of a threshold voltage of the second switching device Tr2. That is, because the second discharging voltage VSS2 applied to the source electrode of the second switching device Tr2, which is an NMOS transistor, has a value higher than the fourth discharging voltage VSS4 applied to the gate electrode of the second switching device Tr2, the gate-source voltage of the second switching device Tr2 has a negative value, thereby enabling the second switching device Tr2 to be kept completely turned off.

Here, the charging voltage VDD is transferred by a charging voltage line, the first charging voltage VDD1 is transferred by a first charging voltage line, the second charging voltage VDD2 is transferred by a second charging voltage line, the first discharging voltage VSS1 is transferred by a first discharging voltage line, the second discharging voltage VSS2 is transferred by a second discharging voltage line, the third discharging voltage VSS3 is transferred by a third discharging voltage line, and the fourth discharging voltage VSS4 is transferred by a fourth discharging voltage line.

Here, the first discharging voltage VSS1 may be the same as any one of the second discharging voltage VSS2 and third discharging voltage VSS3. Also, the first discharging voltage VSS1 may be lower than the second discharging voltage VSS2. Also, the third discharging voltage VSS3 and the fourth discharging voltage VSS4 may be lower than the first discharging voltage VSS1.

On the other hand, the node controller NC of the nth stage may further include third and fourth switching devices Tr3 and Tr4, as shown in FIG. 10.

The third switching device Tr3 is controlled by a scan pulse from the (n−p)th stage and is connected between the charging voltage line which transfers the charging voltage VDD and the set node Q.

The fourth switching device Tr4 is controlled by a scan pulse from the (n+q)th stage and is connected between the set node Q and the second discharging voltage line which transfers the second discharging voltage VSS2.

The configurations of the first and second inverter circuits INV1 and INV2 in FIG. 10 will hereinafter be described in more detail.

Figure 11:
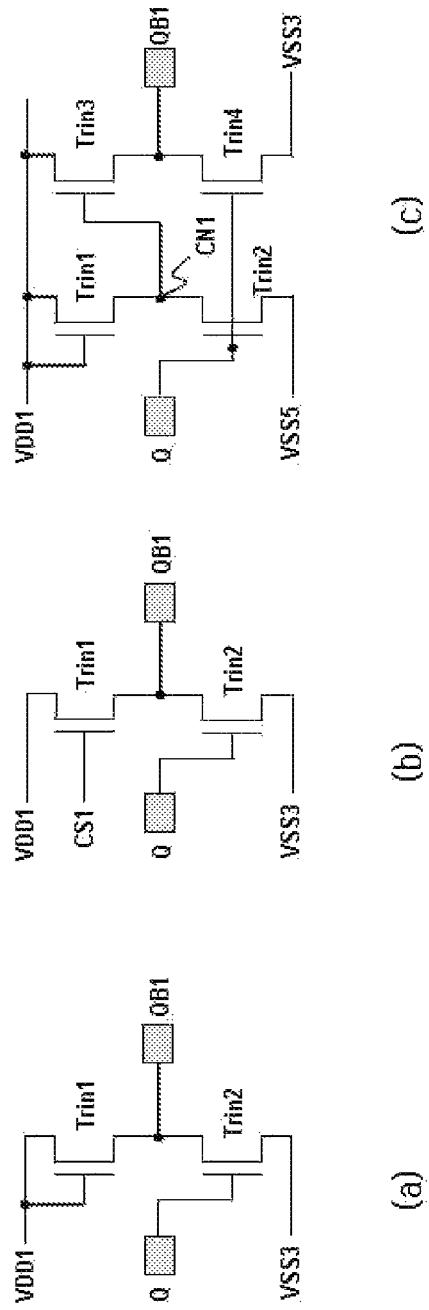
FIG. 11 is a circuit diagram showing a variety of configurations of a first inverter circuit in FIG. 10.

FIG. 11 is a circuit diagram showing a variety of configurations of the first inverter circuit INV1 in FIG. 10. The first inverter circuit INV1 in FIG. 10 may include any one of circuit configurations shown in FIGS. 11(a), 11(b) and 11(c).

The first inverter circuit INV1 includes first and second inverting switching devices Trin1 and Trin2, as shown in FIG. 11(a).

The first inverting switching device Trin1 is controlled according to the first charging voltage VDD1 and is connected between the first charging voltage line which transfers the first charging voltage VDD1 and the first reset node QB1.

The second inverting switching device Trin2 is controlled according to a voltage at the set node Q and is connected between the first reset node QB1 and the third discharging voltage line which transfers the third discharging voltage VSS3.

Alternatively, the first inverter circuit INV1 may include first and second inverting switching devices Trin1 and Trin2, as shown in FIG. 11(b).

The first inverting switching device Trin1 is controlled according to an external first control signal CS1 and is connected between the first charging voltage line which transfers the first charging voltage VDD1 and the first reset node QB1. Here, the first control signal CS1 may be any one of the plurality of clock pulses CLK1 to CLK4 with the phase differences. In detail, the first control signal CS1 supplied to the first inverting switching device Trin1 provided in the nth stage may be a clock pulse corresponding to the scan pulse output from the nth stage. For example, the first inverting switching device Trin1 provided in the second stage ST2 may be supplied with, as the first control signal CS1, the second clock pulse CLK2 which is used as the second scan pulse SP2.

The second inverting switching device Trin2 is controlled according to the voltage at the set node Q and is connected between the first reset node QB1 and the third discharging voltage line which transfers the third discharging voltage VSS3.

As another alternative, the first inverter circuit INV1 may include first to fourth inverting switching devices Trin1, Trin2, Trin3 and Trin4, as shown in FIG. 11(c).

The first inverting switching device Trin1 is controlled according to the first charging voltage VDD1 and is connected between the first charging voltage line which transfers the first charging voltage VDD1 and a first common node CN1.

The second inverting switching device Trin2 is controlled according to the voltage at the set node Q and is connected between the first common node CN1 and a fifth discharging voltage line which transfers a fifth discharging voltage VSS5.

The third inverting switching device Trin3 is controlled according to a voltage at the first common node CN1 and is connected between the first charging voltage line and the first reset node QB1.

The fourth inverting switching device Trin4 is controlled according to the voltage at the set node Q and is connected between the first reset node QB1 and the third discharging voltage line which transfers the third discharging voltage VSS3.

Here, the fifth discharging voltage VSS5 and the third discharging voltage VSS3 may have the same value. Alternatively, the fifth discharging voltage VSS5 may have a value equal to or lower than the third discharging voltage VSS3.

Figure 12:
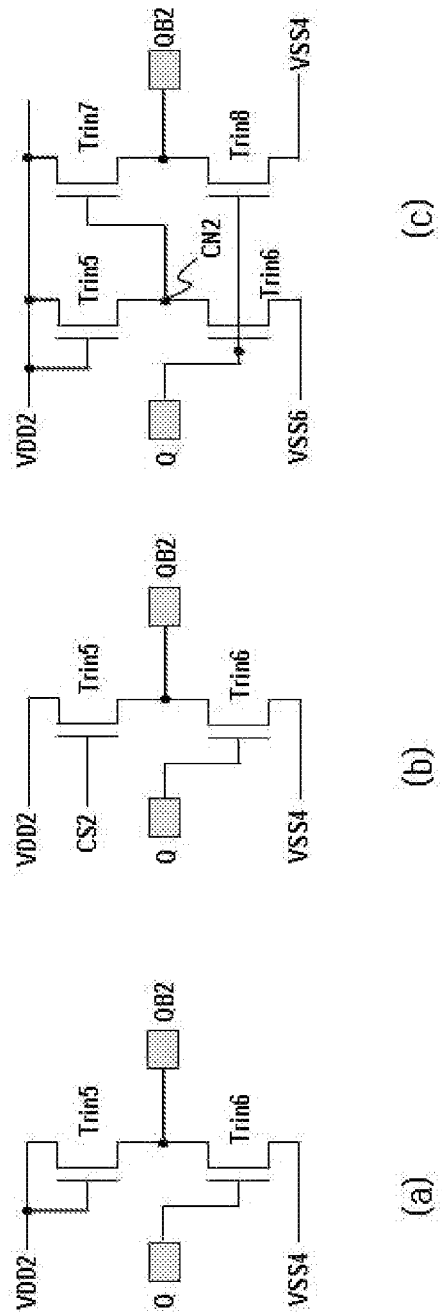
FIG. 12 is a circuit diagram showing a variety of configurations of a second inverter circuit in FIG. 10.

FIG. 12 is a circuit diagram showing a variety of configurations of the second inverter circuit INV2 in FIG. 10. The second inverter circuit INV2 in FIG. 10 may include any one of circuit configurations shown in FIGS. 12(a), 12(b) and 12(c).

The second inverter circuit INV2 includes fifth and sixth inverting switching devices Trin5 and Trin6, as shown in FIG. 12(a).

The fifth inverting switching device Trin5 is controlled according to the second charging voltage VDD2 and is connected between the second charging voltage line which transfers the second charging voltage VDD2 and the second reset node QB2.

The sixth inverting switching device Trin6 is controlled according to the voltage at the set node Q and is connected between the second reset node QB2 and the fourth discharging voltage line which transfers the fourth discharging voltage VSS4.

Alternatively, the second inverter circuit INV2 may include fifth and sixth inverting switching devices Trin5 and Trin6, as shown in FIG. 12(b).

The fifth inverting switching device Trin5 is controlled according to an external second control signal CS2 and is connected between the second charging voltage line which transfers the second charging voltage VDD2 and the second reset node QB2. The second control signal CS2 may be the same as the above-stated first control signal CS1. That is, this second control signal CS2 may be any one of the above-stated clock pulses CLK1 to CLK4, too. In this case, the same clock pulse may be used as the first control signal CS1 and the second control signal CS2. In other words, the above-described first inverting switching device Trin1 and the fifth inverting switching device Trin5 may be supplied with the same clock pulse.

The sixth inverting switching device Trin6 is controlled according to the voltage at the set node Q and is connected between the second reset node QB2 and the fourth discharging voltage line which transfers the fourth discharging voltage VSS4.

As another alternative, the second inverter circuit INV2 may include fifth to eighth inverting switching devices Trin5, Trin6, Trin7 and Trin8, as shown in FIG. 12(c).

The fifth inverting switching device Trin5 is controlled according to the second charging voltage VDD2 and is connected between the second charging voltage line which transfers the second charging voltage VDD2 and a second common node CN2.

The sixth inverting switching device Trin6 is controlled according to the voltage at the set node Q and is connected between the second common node CN2 and a sixth discharging voltage line which transfers a sixth discharging voltage VSS6.

The seventh inverting switching device Trin7 is controlled according to a voltage at the second common node CN2 and is connected between the second charging voltage line and the second reset node QB2.

The eighth inverting switching device Trin8 is controlled according to the voltage at the set node Q and is connected between the second reset node QB2 and the fourth discharging voltage line which transfers the fourth discharging voltage VSS4.

Here, the fifth discharging voltage VSS5 and the fourth discharging voltage VSS4 may have the same value. Alternatively, the fifth discharging voltage VSS5 may have a value equal to or lower than the fourth discharging voltage VSS4. Also, the sixth discharging voltage VSS6 may be the same as the fifth discharging voltage VSS5. Also, the third to sixth discharging voltages VSS3 to VSS6 may all have the same value.

Figure 13:
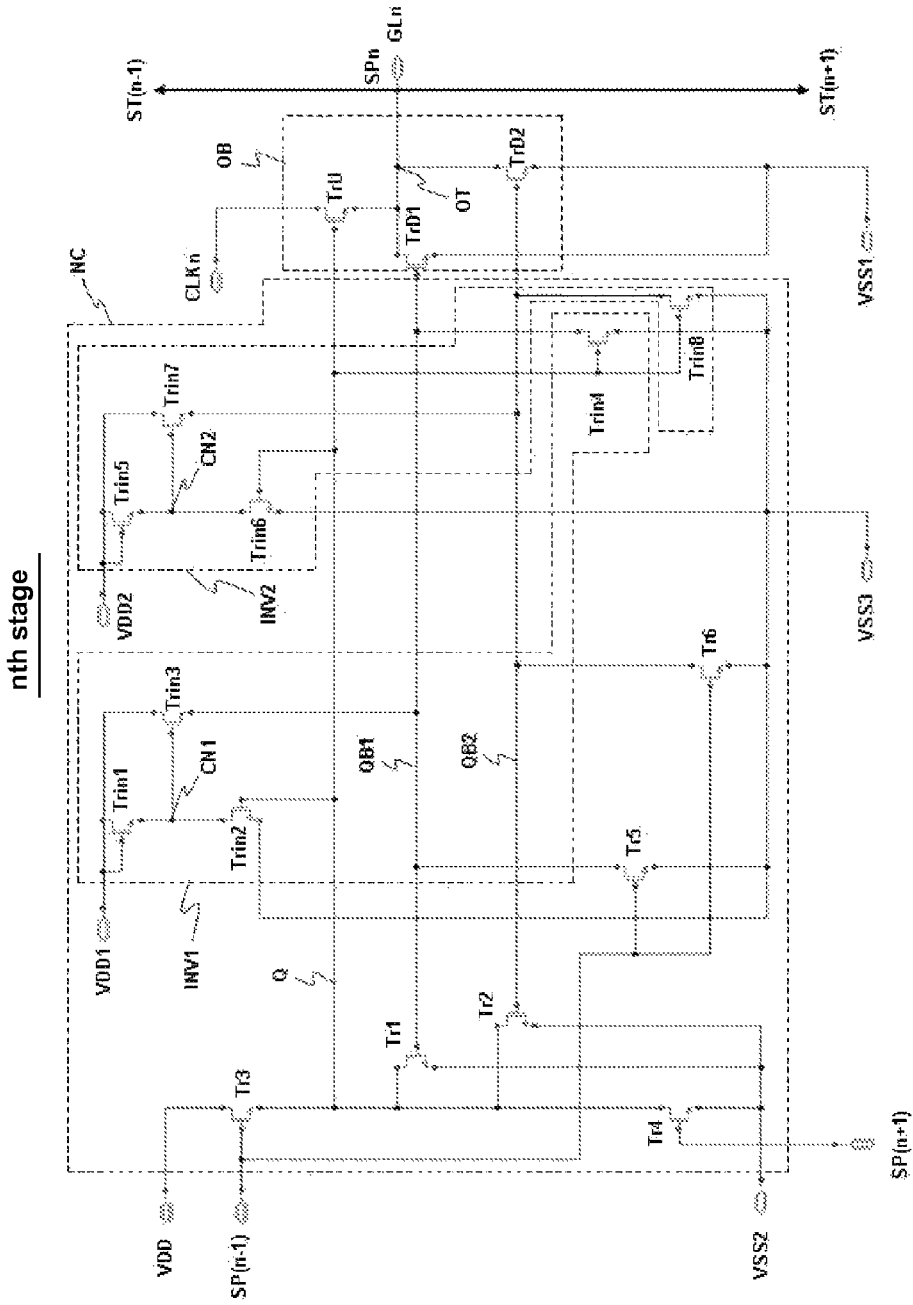
FIG. 13 is a circuit diagram showing the configuration of an nth stage of FIG. 10 in detail.

FIG. 13 is a circuit diagram showing the configuration of the nth stage of FIG. 10 in detail.

The first inverter circuit INV1 in FIG. 13 may include any one of the circuit configurations shown in FIGS. 11(a), 11(b) and 11(c), and the second inverter circuit INV2 in FIG. 13 may include any one of the circuit configurations shown in FIGS. 12(a), 12(b) and 12(c). FIG. 13 shows one example in which the nth stage has the first inverter circuit INV1 shown in FIG. 11(c) and the second inverter circuit INV2 shown in FIG. 12(c).

The node controller NC of the nth stage includes first to sixth switching devices Tr1, Tr2, Tr3, Tr4, Tr5 and Tr6, as shown in FIG. 13. The configurations of the first to fourth switching devices Tr1 to Tr4 among them are the same as those of the first to fourth switching devices Tr1 to Tr4 described above with reference to FIG. 10, and a description thereof will thus be substituted by the description of the configurations of the first to fourth switching devices Tr1 to Tr4 in FIG. 10.

The fifth switching device Tr5 is controlled by the scan pulse from the (n−p)th stage and is connected between the first reset node QB1 and the third discharging voltage line which transfers the third discharging voltage VSS3.

The sixth switching device Tr6 is controlled by the scan pulse from the (n−p)th stage and is connected between the second reset node QB2 and the third discharging voltage line which transfers the third discharging voltage VSS3.

On the other hand, the output unit OB of the nth stage includes a pull-up switching device TrU, a first pull-down switching device TrD1, and a second pull-down switching device TrD2.

The pull-up switching device TrU is controlled by the voltage at the set node Q and is connected between a clock transfer line which transfers any one of the clock pulses CLK1 to CLK4 with the phase differences and the output terminal OT of the nth stage.

The first pull-down switching device TrD1 is controlled by a voltage at the first reset node QB1 and is connected between the output terminal OT and the first discharging voltage line which transfers the first discharging voltage VSS1.

The second pull-down switching device TrD2 is controlled by a voltage at the second reset node QB2 and is connected between the output terminal OT and the first discharging voltage line which transfers the first discharging voltage VSS1.

The operation of the nth stage configured in this manner will hereinafter be described in detail with reference to FIGS. 4 and 13. Here, it is assumed that the nth stage is the third stage ST3.

First, a description will be given of an operation in a set period of a first frame. Here, it is assumed that, for a period of the first frame, the first charging voltage VDD1 is maintained at a high voltage and the second charging voltage VDD2 is maintained at a low voltage.

The third, fifth and sixth switching devices Tr3, Tr5 and Tr6 in the third stage ST3 are turned on in response to the second scan pulse SP2 from the second stage ST2. Then, the charging voltage VDD is supplied to the set node Q through the turned-on third switching device Tr3. As a result, the set node Q is charged with a voltage corresponding to a high logic value, and the second inverting switching device Trin2, fourth inverting switching device Trin4, sixth inverting switching device Trin6, eighth inverting switching device Trin8 and pull-up switching device TrU, connected to the charged set node Q through their respective gate electrodes, are turned on. On the other hand, the first inverting switching device Trin1 is always kept turned on because it is connected between the first charging voltage line and the first common node CN1 in a diode form. Also, the fifth inverting switching device Trin5 is always kept turned off because it is connected between the second charging voltage line and the second common node CN2 in a diode form. Also, the fourth switching device Tr4 in the third stage ST3 is kept turned off because the scan pulse from the fourth stage ST4 is low in this set period.

Also, the third discharging voltage VSS3 is supplied to the first reset node QB1 through the turned-on fifth switching device Tr5, so as to discharge the first reset node QB1. As a result, the first switching device Tr1 and first pull-down switching device TrD1, connected to the discharged first reset node QB1 through their respective gate electrodes, are turned off.

Also, the third discharging voltage VSS3 is supplied to the second reset node QB2 through the turned-on sixth switching device Tr6, so as to discharge the second reset node QB2. As a result, the second switching device Tr2 and second pull-down switching device TrD2, connected to the discharged second reset node QB2 through their respective gate electrodes, are turned off.

Also, the third discharging voltage VSS3 is supplied to the first common node CN1 through the turned-on second inverting switching device Trin2. Accordingly, the first common node CN1 is discharged, and the third inverting switching device Trin3, connected to the discharged first common node CN1 through the gate electrode thereof, is turned off.

Also, the third discharging voltage VSS3 is supplied to the first reset node QB1 through the turned-on fourth inverting switching device Trin4, so as to discharge the first reset node QB1.

Also, the third discharging voltage VSS3 is supplied to the second reset node QB2 through the turned-on eighth inverting switching device Trin8, so as to discharge the second reset node QB2.

The state of the first switching device Tr1 in this set period is as follows. It can be seen that the third discharging voltage VSS3 corresponding to a low logic value is supplied to the gate electrode of the first switching device Tr1 and the second discharging voltage VSS2 corresponding to a low logic value is supplied to the source electrode of the first switching device Tr1. At this time, the gate-source voltage of the first switching device Tr1 is maintained at a negative value lower than 0, because the third discharging voltage VSS3 has a value lower than that of the second discharging voltage VSS2, as stated previously. As a result, in this set period, the first switching device Tr1 can be kept completely turned off, so that the voltage at the set node Q can be prevented from being reduced due to leakage current from the first switching device Tr1.

It can be seen that the state of the second switching device Tr2 is the same as that of the first switching device Tr1 in the same manner, too.

On the other hand, in this set period, the fourth scan pulse SP4 of the low state from the fourth stage ST4 is supplied to the gate electrode of the fourth switching device Tr4. This fourth scan pulse SP4 of the low state has a value lower than that of the second discharging voltage VSS2. Accordingly, the gate-source voltage of the fourth switching device Tr4 is maintained at a negative value lower than 0, too. As a result, in this set period, the voltage at the set node Q can be prevented from being reduced due to leakage current from the fourth switching device Tr4.

Next, a description will be given of an operation in an output period.

In the output period, the third clock pulse CLK3 is supplied to the drain electrode of the turned-on pull-up switching device TrU. At this time, the voltage at the floating set node Q is bootstrapped by the third clock pulse CLK3. As a result, the pull-up switching device TrU is completely turned on, and the third clock pulse CLK3 is output through the turned-on pull-up switching device TrU. That is, the third clock pulse CLK3 is output as the third scan pulse SP3 through the output terminal OT. This third scan pulse SP3 is supplied to the third gate line, the second stage ST2 and the fourth stage ST4. In detail, the third scan pulse SP3 supplied to the second stage ST2 is applied to the gate electrode of the fourth switching device Tr4 of the second stage ST2. Also, the third scan pulse SP3 supplied to the fourth stage ST4 is supplied to the gate electrodes of the third, fifth and sixth switching devices Tr3, Tr5 and Tr6 of the fourth stage ST4. The second stage ST2 is reset by the third scan pulse SP3, and the fourth stage ST4 is set by the third scan pulse SP3.

Next, a description will be given of an operation in a reset period.

In the reset period, the fourth scan pulse SP4 from the fourth stage ST4 is supplied to the third stage ST3. In detail, this fourth scan pulse SP4 is supplied to the gate electrode of the fourth switching device Tr4 of the third stage ST3. As a result, the fourth switching device Tr4 is turned on, and the second discharging voltage VSS2 is supplied to the set node Q through the turned-on fourth switching device Tr4. Accordingly, the set node Q is discharged, and the second inverting switching device Trin2, fourth inverting switching device Trin4, sixth inverting switching device Trin6, eighth inverting switching device Trin8 and pull-up switching device TrU, connected to the discharged set node Q through their respective gate electrodes, are turned off.

At this time, as the second inverting switching device Trin2 is turned off, the first common node CN1 is charged with the first charging voltage VDD1, thereby causing the third inverting switching device Trin3 to be turned on. Also, as the fourth inverting switching device Trin4 is turned off, the first reset node QB1 is charged with the first charging voltage VDD1. As a result, the first switching device Tr1 and first pull-down switching device TrD1, connected to the charged first reset node QB1 through their respective gate electrodes, are turned on. Then, the second discharging voltage VSS2 is supplied to the set node Q through the turned-on first switching device Tr1. Also, the first discharging voltage VSS1 is supplied to the output terminal OT through the turned-on first pull-down switching device TrD1.

On the other hand, the second common node CN2 is kept discharged, thereby causing the second reset node QB2 to remain in its previous discharged state. Thus, the second switching device Tr2 and second pull-down switching device TrD2, connected to the discharged second reset node QB2 through their respective gate electrodes, are kept turned off.

On the other hand, in a second frame, the first charging voltage VDD1 has a low voltage and the second charging voltage VDD2 has a high voltage, so that, in a reset period, the first reset node QB1 is discharged and the second reset node QB2 is charged. Accordingly, in this reset period, the first discharging voltage VSS1 is output by the second pull-down switching device TrD2 turned on instead of the first pull-down switching device TrD1.

This shift register according to the present invention has effects as follows.

Figure 14:
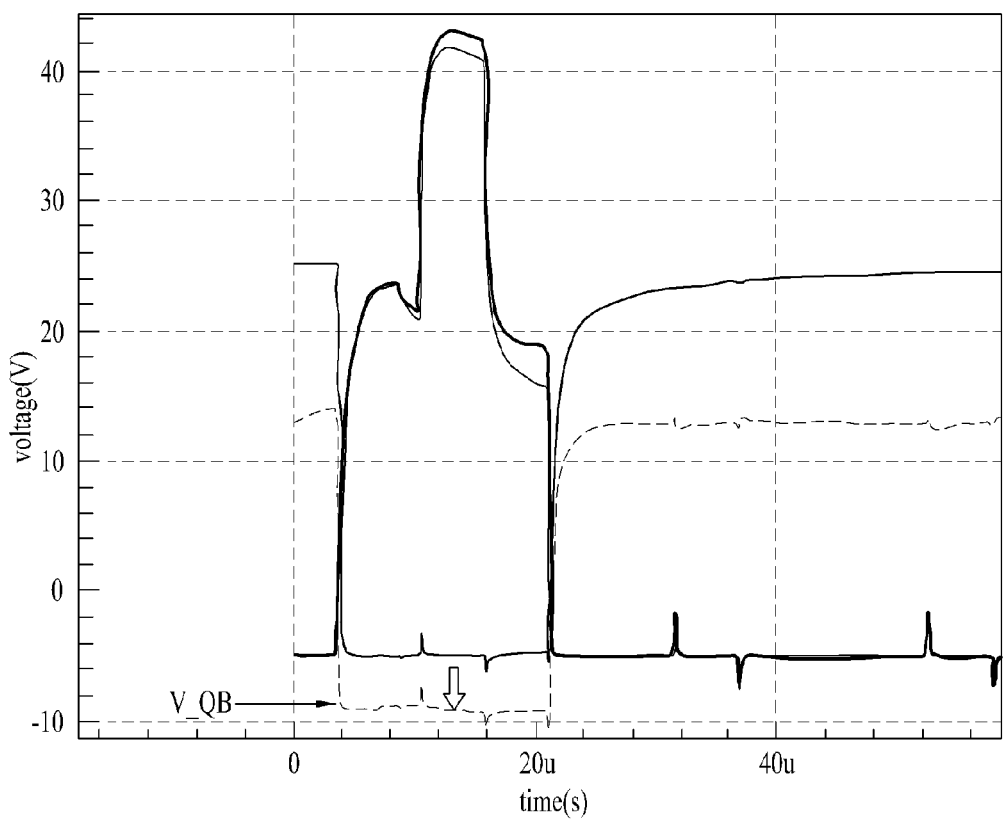
FIG. 14 is a waveform diagram of a voltage at a reset node, generated by the shift register of FIG. 3 based on the configuration of FIG. 7.

FIG. 14 is a waveform diagram of the voltage V_QB at the reset node QB, generated by the shift register of FIG. 3 based on the configuration of FIG. 7.

According to FIG. 14, in the case where both the first discharging voltage VSS1 and second discharging voltage VSS2 are maintained at −5V and the third discharging voltage VSS3 is maintained at −10V, the voltage at the reset node QB can be maintained at a value lower than an existing one, thereby making it possible to minimize leakage current from the set node Q.

Figure 15:
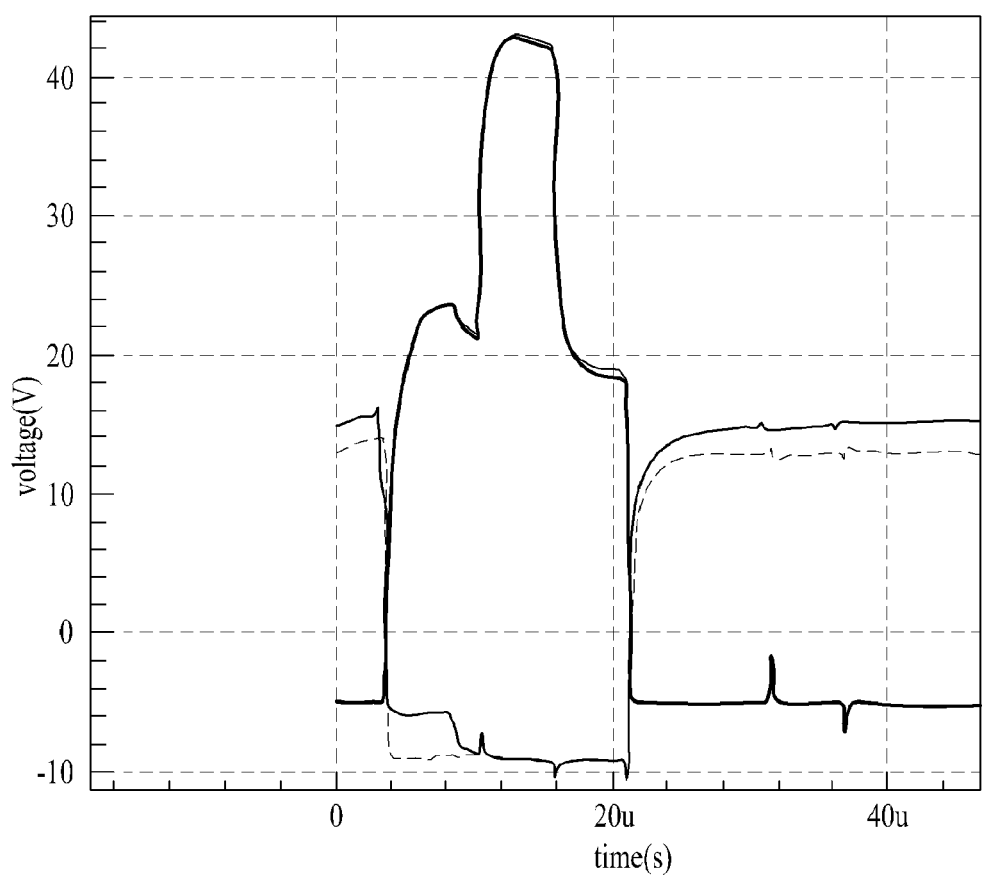
FIG. 15 is a waveform diagram of a voltage at a reset node, generated by the shift register of FIG. 3 based on the configuration of FIG. 8.

FIG. 15 is a waveform diagram of the voltage V_QB at the reset node QB, generated by the shift register of FIG. 3 based on the configuration of FIG. 8.

According to FIG. 15, the voltage at the reset node QB can be maintained at a value lower than an existing one, so that leakage current from the set node Q can be minimized.

Figure 16:
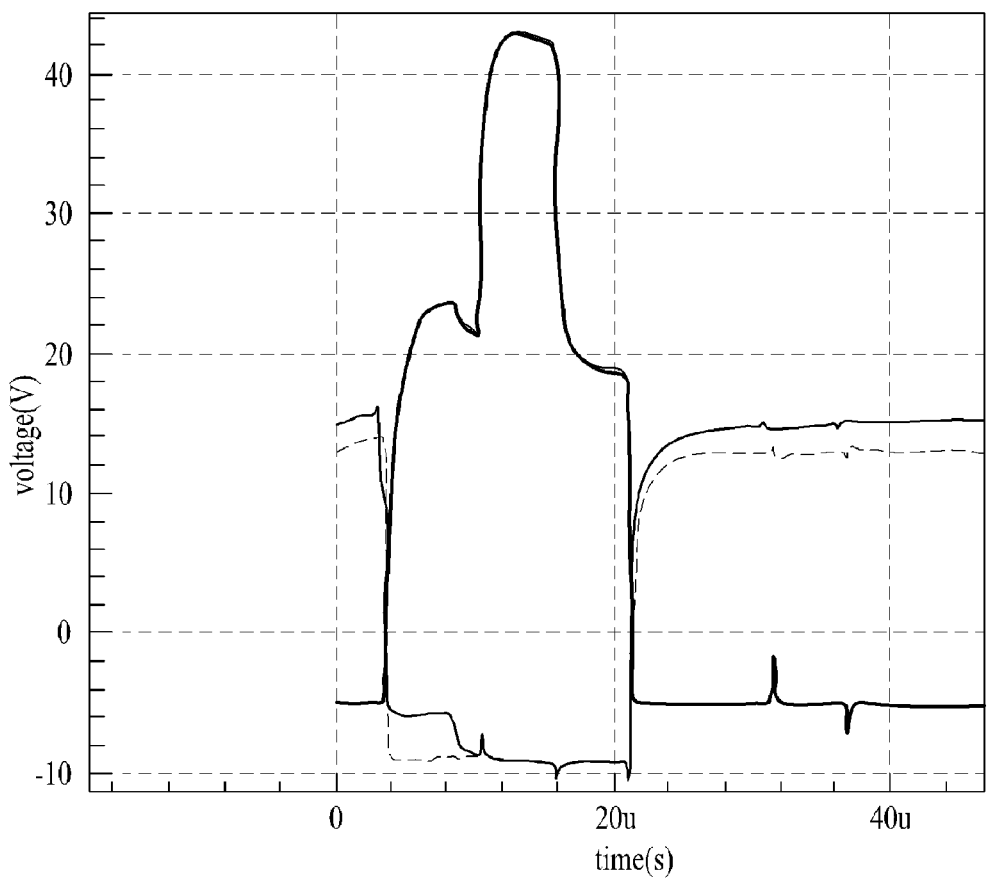
FIG. 16 is a waveform diagram of a voltage at a reset node, generated by the shift register of FIG. 3 based on the configuration of FIG. 9.

FIG. 16 is a waveform diagram of the voltage V_QB at the reset node QB, generated by the shift register of FIG. 3 based on the configuration of FIG. 9.

According to FIG. 16, in the case where the first discharging voltage VSS1 is maintained at −8V, the second discharging voltage VSS2 is maintained at −5V and the third discharging voltage VSS3 is maintained at −10V, the voltage at the reset node QB can be maintained at a value lower than an existing one, thereby making it possible to minimize leakage current from the set node Q.

On the other hand, in all of the embodiments, when voltages to be compared with each other have the same polarity, the comparison is made based on, not the absolute values of the levels of the voltages, but the levels themselves. For example, the second discharging voltage VSS2 and third discharging voltage VSS3 in FIG. 5 may both be negative. In this case, that the third discharging voltage VSS3 is lower than the second discharging voltage VSS2 means that the second discharging voltage VSS2 is, for example, −5V if the third discharging voltage VSS3 is, for example, −10V.

As is apparent from the above description, a shift register according to the present invention has effects as follows.

The levels of discharging voltages supplied to the gate electrode and source electrode of a switching device which is in charge of discharging of a set node are set in such a manner that the discharging voltage supplied to the gate electrode is kept lower than the discharging voltage supplied to the source electrode. Therefore, it is possible to prevent a voltage at the set node from being reduced due to leakage current from the switching device in a set period.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages for sequentially outputting scan pulses, wherein an nth one of the stages (where n is a natural number) comprises:
    a node controller for controlling voltages at nodes; and
    an output unit for outputting any one of a corresponding one of the scan pulses and a first discharging voltage in response to the voltages at the nodes,
    wherein the nodes comprise a set node, a first reset node and a second reset node,
    wherein the node controller of the nth stage comprises:
    a first switching device controlled by a voltage supplied to the first reset node for supplying a second discharging voltage to the set node;
    a second switching device controlled by a voltage supplied to the second reset node for supplying the second discharging voltage to the set node;
    a first inverter circuit controlled by a voltage supplied to the set node for supplying any one of a first charging voltage and a third discharging voltage to the first reset node; and
    a second inverter circuit controlled by the voltage supplied to the set node for supplying any one of a second charging voltage and a fourth discharging voltage to the second reset node, and
    wherein the third discharging voltage and the fourth discharging voltage are lower than the second discharging voltage.

2. The shift register according to claim 1, wherein:
    the first inverter circuit supplies the third discharging voltage to the first reset node when a voltage corresponding to a high logic value is supplied to the set node, and supplies the first charging voltage to the first reset node when a voltage corresponding to a low logic value is supplied to the set node; and
    the second inverter circuit supplies the fourth discharging voltage to the second reset node when the voltage corresponding to the high logic value is supplied to the set node, and supplies the second charging voltage to the second reset node when the voltage corresponding to the low logic value is supplied to the set node,
    wherein each of the first charging voltage and second charging voltage alternately has a high voltage and a low voltage at intervals of m frame periods (where m is a natural number), and
    wherein the first charging voltage and the second charging voltage have different voltages in the same frame period.

3. The shift register according to claim 2, wherein:
the first inverter circuit comprises:
a first inverting switching device controlled according to the first charging voltage and connected between a first charging voltage line transferring the first charging voltage and the first reset node; and
a second inverting switching device controlled according to a voltage at the set node and connected between the first reset node and a third discharging voltage line transferring the third discharging voltage; and
the second inverter circuit comprises:
a third inverting switching device controlled according to the second charging voltage and connected between a second charging voltage line transferring the second charging voltage and the second reset node; and
a fourth inverting switching device controlled according to the voltage at the set node and connected between the second reset node and a fourth discharging voltage line transferring the fourth discharging voltage.

4. The shift register according to claim 2, wherein:
the first inverter circuit comprises:
a first inverting switching device controlled according to an external first control signal and connected between a first charging voltage line transferring the first charging voltage and the first reset node; and
a second inverting switching device controlled according to a voltage at the set node and connected between the first reset node and a third discharging voltage line transferring the third discharging voltage; and
the second inverter circuit comprises:
a third inverting switching device controlled according to an external second control signal and connected between a second charging voltage line transferring the second charging voltage and the second reset node; and
a fourth inverting switching device controlled according to the voltage at the set node and connected between the second reset node and a fourth discharging voltage line transferring the fourth discharging voltage.

5. The shift register according to claim 2, wherein:
the first inverter circuit comprises:
a first inverting switching device controlled according to the first charging voltage and connected between a first charging voltage line transferring the first charging voltage and a first common node;
a second inverting switching device controlled according to a voltage at the set node and connected between the first common node and a fifth discharging voltage line transferring a fifth discharging voltage;
a third inverting switching device controlled according to a voltage at the first common node and connected between the first charging voltage line and the first reset node; and
a fourth inverting switching device controlled according to the voltage at the set node and connected between the first reset node and a third discharging voltage line transferring the third discharging voltage; and
the second inverter circuit comprises:
a fifth inverting switching device controlled according to the second charging voltage and connected between a second charging voltage line transferring the second charging voltage and a second common node;
a sixth inverting switching device controlled according to the voltage at the set node and connected between the second common node and a sixth discharging voltage line transferring a sixth discharging voltage;
a seventh inverting switching device controlled according to a voltage at the second common node and connected between the second charging voltage line and the second reset node; and
an eighth inverting switching device controlled according to the voltage at the set node and connected between the second reset node and a fourth discharging voltage line transferring the fourth discharging voltage.

6. The shift register according to claim 1, wherein the first discharging voltage is the same as any one of the second discharging voltage and third discharging voltage.

7. The shift register according to claim 1, wherein the first discharging voltage is lower than the second discharging voltage.

8. The shift register according to claim 1, wherein the third discharging voltage is the same as the fourth discharging voltage.

9. The shift register according to claim 1, wherein the third discharging voltage and the fourth discharging voltage are lower than the first discharging voltage.

10. The shift register according to claim 1, wherein the node controller of the nth stage further comprises:
a third switching device controlled by a scan pulse from an (n−p)th one of the stages (where p is a natural number less than n) and connected between a charging voltage line transferring a charging voltage and the set node; and
a fourth switching device controlled by a scan pulse from an (n+q)th one of the stages (where q is a natural number) and connected between the set node and a second discharging voltage line transferring the second discharging voltage.

11. The shift register according to claim 10, wherein the node controller of the nth stage further comprises:
a fifth switching device controlled by the scan pulse from the (n−p)th stage and connected between the first reset node and a third discharging voltage line transferring the third discharging voltage; and
a sixth switching device controlled by the scan pulse from the (n−p)th stage and connected between the second reset node and the third discharging voltage line.

12. The shift register according to claim 1, wherein the output unit of the nth stage comprises:
a pull-up switching device controlled by a voltage at the set node and connected between a clock transfer line transferring any one of a plurality of clock pulses having phase differences thereamong and an output terminal of the nth stage;
a first pull-down switching device controlled by a voltage at the first reset node and connected between the output terminal and a first discharging voltage line transferring the first discharging voltage; and
a second pull-down switching device controlled by a voltage at the second reset node and connected between the output terminal and the first discharging voltage line transferring the first discharging voltage.

13. The shift register according to claim 4, wherein each of the first and second control signals is any one of a plurality of clock pulses having phase differences thereamong,
wherein each of the first and second control signals supplied respectively to the first and third inverting switching devices in the nth stage is one of the clock pulses corresponding to the scan pulse output from the nth stage.

14. The shift register according to claim 5, wherein the third to sixth discharging voltages are all the same.

* * * * *